US012678822B2

(12) United States Patent
Schulkins et al.

(10) Patent No.: US 12,678,822 B2
(45) Date of Patent: Jul. 14, 2026

(54) METHODS AND SYSTEMS FOR SUBSTRATE FUNCTIONALIZATION

(71) Applicant: Ultima Genomics, Inc., Fremont, CA (US)

(72) Inventors: William Schulkins, Campbell, CA (US); Angela Stern, Palo Alto, CA (US); Florian Oberstrass, Menlo Park, CA (US)

(73) Assignee: Ultima Genomics, Inc., Fremont, CA (US)

( * ) Notice: Subject to any disclaimer, the term of this patent is extended or adjusted under 35 U.S.C. 154(b) by 79 days.

(21) Appl. No.: 18/608,317

(22) Filed: Mar. 18, 2024

(65) Prior Publication Data

US 2024/0326090 A1 Oct. 3, 2024

Related U.S. Application Data

(63) Continuation of application No. PCT/US2022/044269, filed on Sep. 21, 2022.
(Continued)

(51) Int. Cl.
*B05D 1/00* (2006.01)
*B05D 1/32* (2006.01)
(Continued)

(52) U.S. Cl.
CPC ................. *B05D 1/60* (2013.01); *B05D 1/32* (2013.01); *B05D 1/322* (2013.01); *C23C 16/402* (2013.01); *C23C 16/56* (2013.01)

(58) Field of Classification Search
CPC .. B05D 1/32; B05D 1/322; B05D 1/60; C23C 16/402; C23C 16/56
(Continued)

(56) References Cited

U.S. PATENT DOCUMENTS 5,372,851 A * 12/1994 Ogawa ..................... B82Y 5/00
427/419.8
5,474,796 A * 12/1995 Brennan ................ C07H 21/00
435/317.1
(Continued)

FOREIGN PATENT DOCUMENTS

WO WO-2020118172 A1 6/2020
WO WO-2020186243 A1 9/2020
WO WO-2023049192 A1 3/2023

OTHER PUBLICATIONS

PCT/US2022/044269 International Search Report and Written Opinion dated Feb. 28, 2023.

*Primary Examiner* — Brian K Talbot
(74) *Attorney, Agent, or Firm* — Wilson Sonsini Goodrich & Rosati

(57) ABSTRACT

Provided herein are systems and methods for functionalizing a substrate. The method may comprise providing a substrate surface, wherein the substrate surface comprises a plurality of individually addressable locations, and exposing the substrate surface to a dose of organosilane vapor to generate a plurality of organosilane-functionalized locations on the substrate surface, wherein the plurality of organosilane-functionalized locations corresponds to at least a subset of the plurality of individually addressable locations. The dose of organosilane vapor may be provided at relatively low dose, in an example, at most about $1 \times 10^{24}$ molecules per $m^2$.

15 Claims, 18 Drawing Sheets

Avg. Edge Height = 2.7 nm

Std. Deviation = 0.7 nm

Related U.S. Application Data

(60) Provisional application No. 63/247,196, filed on Sep. 22, 2021.

(51) Int. Cl.
  *C23C 16/40*  (2006.01)
  *C23C 16/56*  (2006.01)

(58) Field of Classification Search
  USPC ........................... 427/255.13, 255.393, 255.6
  See application file for complete search history.

(56)  References Cited

U.S. PATENT DOCUMENTS

| | | | | |
|---|---|---|---|---|
| 5,688,642 | A * | 11/1997 | Chrisey ................... | B82Y 5/00 |
| | | | | 435/5 |
| 8,765,359 | B2 * | 7/2014 | Fernandez .............. | G03F 7/405 |
| | | | | 430/315 |
| 10,512,911 | B1 | 12/2019 | Beckett et al. | |
| 2005/0272268 | A1 | 12/2005 | Hwang et al. | |
| 2007/0128455 | A1 * | 6/2007 | Wolf ................... | G01N 33/553 |
| | | | | 427/407.1 |
| 2009/0270273 | A1 * | 10/2009 | Burns ................. | C12Q 1/6837 |
| | | | | 506/17 |
| 2010/0075034 | A1 * | 3/2010 | Kobrin ................ | C23C 16/0227 |
| | | | | 427/248.1 |
| 2013/0323652 | A1 | 12/2013 | Fernandez et al. | |
| 2021/0079464 | A1 | 3/2021 | Beckett et al. | |
| 2023/0349893 | A1 * | 11/2023 | Didar .............. | G01N 33/54353 |

* cited by examiner

501

(A)

(B)

(C)

| Parameters | Unit | 0-1 | 2-3 | 4-5 | 6-7 | 8-9 |
| --- | --- | --- | --- | --- | --- | --- |
| Height difference | nm | 1.387 | -1.079 | 1.310 | -1.074 | 0.9387 |

Avg. Edge Height = 1.2 nm

Std. Deviation = 0.2 nm

METHODS AND SYSTEMS FOR SUBSTRATE FUNCTIONALIZATION

CROSS REFERENCE

This application is a continuation of International Patent Application No. PCT/US2022/044269, filed Sep. 21, 2022, which claims the benefit of U.S. Provisional Patent Application No. 63/247,196, filed on Sep. 22, 2021, which is hereby incorporated by reference in its entirety.

BACKGROUND

Biological sample processing has various applications in the fields of molecular biology and medicine (e.g., diagnosis). For example, nucleic acid sequencing may provide information that may be used to diagnose a certain condition in a subject and in some cases tailor a treatment plan. Sequencing is widely used for molecular biology applications, including vector designs, gene therapy, vaccine design, industrial strain design and verification. Biological sample processing may involve a fluidics system and/or a detection system.

Despite the advance of sequencing technology, determining sequences with spatial resolution still requires laborious efforts.

SUMMARY

It is advantageous to have a chemical vapor deposition method that can pattern a substrate with regular functionalized regions, and with consistency. However, certain methods which exposes a substrate surface with a relatively high concentration of vapor may result in functionalized regions that have varying heights (e.g., with high standard deviation across the whole surface). Accordingly, recognized herein is a need to address at least the abovementioned problems. Provided herein are systems and methods that can pattern a substrate surface with functionalized regions using relatively low dose of organosilane vapor, which results in relatively regular, organosilane-functionalized locations.

In an aspect, provided is a method for generating organosilane-functionalized locations, comprising (a) providing a substrate, wherein the substrate comprises a plurality of individually addressable location; and (b) exposing the substrate to a dose of organosilane vapor to generate a plurality of organosilane-functionalized locations on the substrate, wherein the plurality of organosilane-functionalized locations corresponds to at least a subset of the plurality of individually addressable locations, and wherein the dose is at most $1\times10^{24}$ molecules per m$^2$.

In some embodiments, the method further comprises exposing the substrate to one or more additional doses of organosilane vapor to generate a second plurality of organosilane-functionalized locations on the substrate, wherein the second plurality of organosilane-functionalized locations corresponds to at least an additional subset of the plurality of individually addressable locations, wherein each dose of the one or more additional doses is at most $1\times10^{24}$ molecules per m$^2$.

In some embodiments, the one or more additional doses comprises at least 2 doses, 3 doses, 4 doses, 5 doses, 8 doses, or 10 doses.

In some embodiments, the dose is at least $1\times1020$ molecules per m2.

In some embodiments, in (a), the plurality of individually addressable locations are defined by a resist.

In some embodiments, the method further comprises, prior to (a), generating the plurality of individually addressable locations on the substrate by depositing the resist on the substrate. In some embodiments, the method further comprises, subsequent to (b), removing the resist from the substrate.

In some embodiments, the resist is a photo-curable resist. In some embodiments, the resist is a thermally curable resist.

In some embodiments, wherein in (b), the exposing is performed at a first predetermined atmospheric pressure.

In some embodiments, the first predetermined atmospheric pressure is about 5 mTorr to about 50 mTorr. In some embodiments, the first predetermined atmospheric pressure is about 15 mTorr to about 25 mTorr.

In some embodiments, an organosilane-functionalized location of the plurality of organosilane-functionalized locations has a height of at least 1.2 nanometers relative to an adjacent non-organosilane-functionalized location on the substrate. In some embodiments, the organosilane-functionalized location has a height of at least 2.0 nanometers. In some embodiments, the organosilane-functionalized location has a height of at least 2.5 nanometers.

In some embodiments, an organosilane-functionalized location of the plurality of organosilane-functionalized locations has a diameter of at most 2.0 microns. In some embodiments, the organosilane-functionalized location has a diameter of at most 1.5 microns, 1 micron, 0.8 microns, or 0.5 microns.

In some embodiments, the plurality of organosilane-functionalized locations has an average diameter of about 0.5 microns, 0.8 microns, 1 micron, 1.5 microns, or 2.0 microns.

In some embodiments, the plurality of organosilane-functionalized locations has an average height of at least 1.2 nanometers relative to an adjacent non-organosilane-functionalized location on the substrate, with a standard deviation of at most about 1.0 nanometers. In some embodiments, the plurality of organosilane-functionalized locations has an average height of at least 2.0 nanometers relative to an adjacent non-organosilane-functionalized location on the substrate, with a standard deviation of at most about 1.0 nanometers. In some embodiments, the plurality of organosilane-functionalized locations has an average height of at least 2.5 nanometers relative to an adjacent non-organosilane-functionalized location on the substrate, with a standard deviation of at most about 1.0 nanometers. In some embodiments, the plurality of organosilane-functionalized locations has an average height of at least 2.0 nanometers relative to an adjacent non-organosilane-functionalized location on the substrate, with a standard deviation of at most about 0.5 nanometers. In some embodiments, the plurality of organosilane-functionalized locations has an average height of at least 2.0 nanometers relative to an adjacent non-organosilane-functionalized location on the substrate, with a standard deviation of at most about 0.3 nanometers.

In some embodiments, an average pitch of the plurality of individually addressable locations is between about 0.2 to about 2 microns, wherein a pitch is measured between respective centers of one individually addressable location and an adjacent individually addressable location. In some embodiments, the average pitch of the plurality of individually addressable locations is between about 0.6 to about 2 microns. In some embodiments, the average pitch of the plurality of individually addressable locations is between about 1.0 to about 2 microns. In some embodiments, the average pitch of the plurality of individually addressable locations is between about 1.5 to about 2 microns.

In some embodiments, a pitch of the plurality of individually addressable locations it not uniform, wherein the pitch is measured between respective centers of one individually addressable location and an adjacent individually addressable location. In some embodiments, the pitch of the plurality of individually addressable locations varies from between about 0.2 to 2 microns. In some embodiments, the plurality of individually addressable locations is arranged in a regular array.

In some embodiments, a first subset of the plurality of individually addressable locations is arranged in a first array and a second subset of the plurality of individually addressable locations is arranged in a second array. In some embodiments, the first array has a first average pitch of the first subset of the plurality of individually addressable locations and wherein the second array has a second average pitch of the second subset of the plurality of individually addressable locations, wherein the first average pitch and the second average pitch are within 0.2 microns. In some embodiments, the first array has a first average pitch of the first subset of the plurality of individually addressable locations and wherein the second array has a second average pitch of the second subset of the plurality of individually addressable locations, wherein the first average pitch and the second average pitch are different.

In some embodiments, the first array comprises a concentric circle pattern.

In some embodiments, an average pitch of the plurality of organosilane-functionalized locations is between about 0.2 to 2 microns, wherein a pitch is measured between respective centers of one organosilane-functionalized location and an adjacent organosilane-functionalized location. In some embodiments, the average pitch of the plurality of organosilane-functionalized locations is between about 1.5 to 2 microns. In some embodiments, the average pitch of the plurality of organosilane-functionalized locations is between about 1 to 2 microns.

In some embodiments, a pitch of the plurality of organosilane-functionalized locations is between about 0.2 to 2 microns, wherein the pitch is measured between respective centers of one organosilane-functionalized location and an adjacent organosilane-functionalized location.

In some embodiments, the plurality of individually addressable locations is arranged in a regular array.

In some embodiments, a first subset of the plurality of individually addressable locations is arranged in a first array and a second subset of the plurality of individually addressable locations is arranged in a second array. In some embodiments, the first array has a first average pitch of the first subset of the plurality of individually addressable locations and wherein the second array has a second average pitch of the second subset of the plurality of individually addressable locations, wherein the first average pitch and the second average pitch are within 0.2 microns. In some embodiments, the first array of the plurality of individually addressable locations and wherein the second array of the plurality of individually addressable locations are different.

In some embodiments, an organosilane-functionalized location of the plurality of organosilane-functionalized locations is elliptical.

In some embodiments, an organosilane-functionalized location of the plurality of organosilane-functionalized locations is substantially circular.

In some embodiments, an organosilane-functionalized location of the plurality of organosilane-functionalized locations is rectangular.

In some embodiments, an organosilane-functionalized location of the plurality of organosilane-functionalized locations is substantially square.

In some embodiments, an organosilane-functionalized location of the plurality of organosilane-functionalized locations is hexagonal.

In some embodiments, an organosilane-functionalized location of the plurality of organosilane-functionalized locations is octagonal.

In some embodiments, the method further comprises immobilizing a bead comprising a nucleic acid molecule adjacent to an organosilane-functionalized location of the plurality of organosilane-functionalized locations, wherein the nucleic acid molecule is coupled to the bead In some embodiments, the bead is immobilized to the organosilane-functionalized location via an electrostatic interaction between a positive charge of the organosilane-functionalized location and a negative charge of the bead or constituent thereof.

In some embodiments, the bead is not immobilized to a non-organosilane-functionalized location on the substrate.

In some embodiments, the method further comprises immobilizing a plurality of beads adjacent to the plurality of organosilane-functionalize locations, wherein the plurality of beads comprises the bead, wherein the plurality of organosilane-functionalized locations has an average diameter of at least 10% of an average bead diameter of the plurality of. In some embodiments, the average diameter is at least 50% of the average bead diameter. In some embodiments, the average diameter is at least 100% of the average bead diameter In some embodiments, the average bead diameter is at least 100 nm. In some embodiments, the average bead diameter is at least 0.1 microns, 0.5 microns, 1.0 micron.

In some embodiments, an organosilane-functionalized location of the plurality of organosilane-functionalized locations comprises aminopropyltrimethoxysilane (APTMS).

In some embodiments, subsequent to (b), the substrate comprises at least about 50,000 organosilane-functionalized locations per millimeter2 (/mm2) for an average pitch of between about 1.0 microns to about 2.0 microns, wherein a pitch is measured between respective centers of one organosilane-functionalized location and an adjacent organosilane-functionalized location.

In some embodiments, subsequent to (b), the substrate comprises at least about 100,000 organosilane-functionalized locations/mm2 for an average pitch of between about 1.0 microns to about 2.0 microns, wherein a pitch is measured between respective centers of one organosilane-functionalized location and an adjacent organosilane-functionalized location.

In some embodiments, subsequent to (b), the substrate comprises at least about 200,000 organosilane-functionalized locations/mm2 for an average pitch of between about 1.0 microns to about 2.0 microns, wherein a pitch is measured between respective centers of one organosilane-functionalized location and an adjacent organosilane-functionalized location.

In some embodiments, subsequent to (b), the substrate comprises at least about 250,000 organosilane-functionalized locations/mm2 for an average pitch of between about 1.0 microns to about 2.0 microns, wherein a pitch is measured between respective centers of one organosilane-functionalized location and an adjacent organosilane-functionalized location.

In some embodiments, subsequent to (b), the substrate comprises at least about 350,000 organosilane-functionalized locations/mm2 for an average pitch of between about 1.0 microns to 2.0 microns, wherein a pitch is measured between respective centers of one organosilane-functionalized location and an adjacent organosilane-functionalized location.

In some embodiments, subsequent to (b), the substrate comprises at least about 500,000 organosilane-functionalized locations/mm2 for an average pitch of between about 1.0 microns to 2.0 microns, wherein a pitch is measured between respective centers of one organosilane-functionalized location and an adjacent organosilane-functionalized location.

In some embodiments, subsequent to (b), the substrate comprises at least about 1.0 million organosilane-functionalized locations/mm2 for an average pitch of between about 1.0 microns to 2.0 microns, wherein a pitch is measured between respective centers of one organosilane-functionalized location and an adjacent organosilane-functionalized location.

In some embodiments, subsequent to (b), the substrate comprises at least about 1.2 million organosilane-functionalized locations/mm2 for an average pitch of between about 1.0 microns to 2.0 microns, wherein a pitch is measured between respective centers of one organosilane-functionalized location and an adjacent organosilane-functionalized location.

In some embodiments, subsequent to (b), the substrate comprises at least about 1.5 million organosilane-functionalized locations/mm2 for an average pitch of between about 1.0 microns to 2.0 microns, wherein a pitch is measured between respective centers of one organosilane-functionalized location and an adjacent organosilane-functionalized location.

In some embodiments, subsequent to (b), the substrate comprises at least about 2.0 million organosilane-functionalized locations/mm2 for an average pitch of between about 1.0 microns to 2.0 microns, wherein a pitch is measured between respective centers of one organosilane-functionalized location and an adjacent organosilane-functionalized location.

In some embodiments, the substrate is a wafer.

In some embodiments, the substrate comprises a substantially planar array.

In some embodiments, an organosilane-functionalized location of said plurality of organosilane-functionalized locations has an edge with an edge thickness of at most 0.25 μm.

In some embodiments, the edge of the organosilane-functionalized location has an edge thickness of at most 0.1 μm.

In some embodiments, the method further comprises, subsequent to (b), storing the substrate comprising the plurality of organosilane-functionalized locations at a temperature range of 19° C. to 22° C. for at least 1 hour.

Another aspect of the present disclosure provides a non-transitory computer readable medium comprising machine executable code that, upon execution by one or more computer processors, implements any of the methods above or elsewhere herein.

Another aspect of the present disclosure provides a system comprising one or more computer processors and computer memory coupled thereto. The computer memory comprises machine executable code that, upon execution by the one or more computer processors, implements any of the methods above or elsewhere herein.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "Figure" and "FIG." herein) of which:

FIG. 2A illustrates a method for loading beads onto specific regions of a substrate. FIG. 2B illustrates a method for loading a subset of beads onto specific regions of a substrate.

DETAILED DESCRIPTION

Figures 1A, 1B, 1C, 1D, 1E, 1F, 1G:
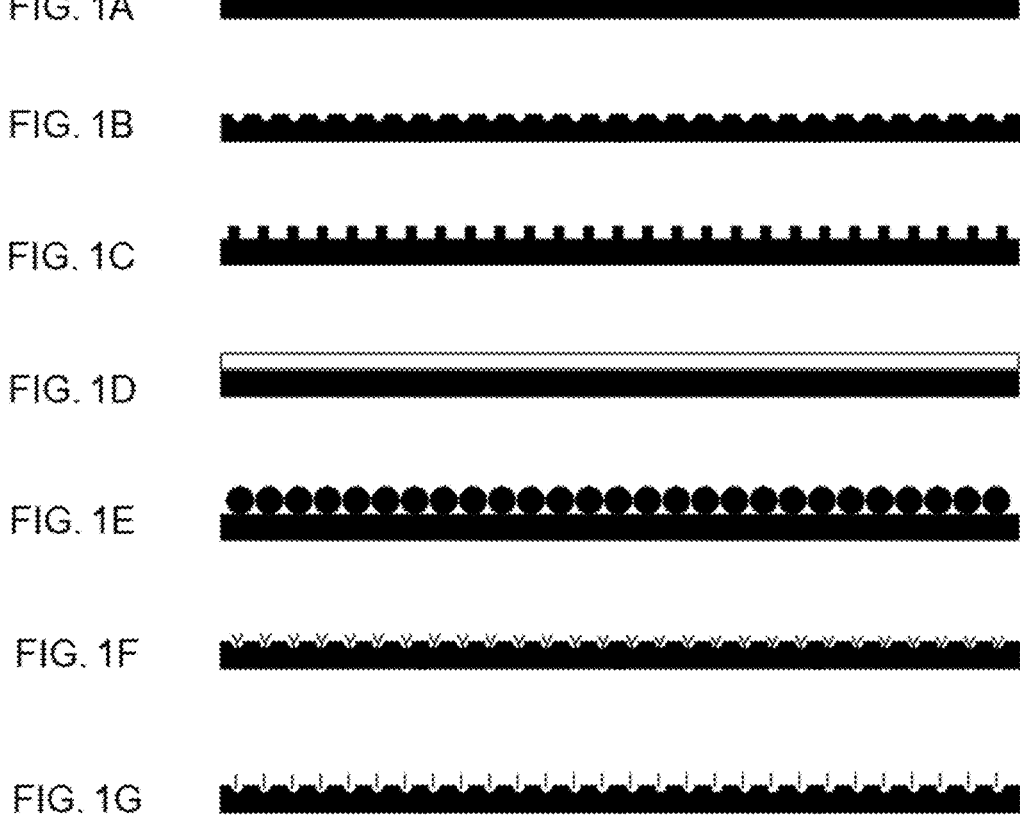
FIGS. 1A-1G illustrate different examples of cross-sectional surface profiles of a substrate.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

Provided herein are systems and methods that can pattern a substrate surface with functionalized regions using relatively low dose of organosilane vapor, which results in relatively regular, organosilane-functionalized locations. Such substrates may be used in the sample processing systems described herein.

The term "analyte" may refer to molecules, cells, biological particles, or organisms (i.e., from a biological sample obtained from a subject). In some instances, a molecule may be a nucleic acid molecule, antibody, antigen, peptide, protein, carbohydrate, or other biological molecule obtained from or derived from a biological sample, or any combination thereof. An analyte may be synthetic.

The terms "dispense" and "disperse" may be used interchangeably herein. In some cases, dispensing may comprise dispersing and/or dispersing may comprise dispensing. Dispensing generally refers to distributing, depositing, providing, or supplying a reagent, solution, or other object, etc. Dispensing may comprise dispersing, which may generally refer to spreading.

The term "open substrate," as used herein, generally refers to a substrate in which any point on an active surface of the substrate is physically accessible from a direction normal to the substrate. In some cases, the surrounding open environment may be controlled and/or confined in a larger controlled environment (e.g., a chamber).

The term "sequencing," as used herein, generally refers to a process for generating or identifying a sequence of a biological molecule, such as a nucleic molecule. Such sequence may be a nucleic acid sequence, which may include a sequence of nucleic acid bases. Sequencing may be single molecule sequencing or sequencing by synthesis, for example. Sequencing may be performed using analyte nucleic acid molecules immobilized on a support, such as a flow cell or one or more beads. In some cases, sequencing may comprise generating sequencing signals and/or sequencing reads from the analyte nucleic acid molecules.
Functionalizing the Substrate with Low Dose Vapor Provided herein are methods for generating functionalized regions on a substrate. Such functionalized regions may act as distinct, individually addressable locations for downstream processing of the substrate. In an example, during such downstream processing, the functionalized regions (e.g., organosilane-functionalized locations) may immobilize a plurality of beads, a bead comprising a plurality of nucleic acid molecules immobilized thereto, such as to facilitate various sequencing reactions and/or processes on the substrate. In an example, such sequencing reactions and/or processes are part of a sequencing-by-synthesis process, and each bead comprises a colony of amplified products.

A method for generating functionalized regions on a substrate may comprise: providing a substrate surface, wherein the substrate surface comprises a plurality of individually addressable locations; and exposing the substrate surface to a dose of organosilane vapor to generate a plurality of organosilane-functionalized locations on the substrate surface, wherein the plurality of organosilane-functionalized locations corresponds to at least a subset of the plurality of individually addressable locations, and wherein the dose is at most $1 \times 10^{24}$ molecules per $m^2$. The organosilane-functionalized locations may then act as distinct, individually addressable locations for downstream processing of the substrate. The substrate may have different individually addressable locations prior to and subsequent to deposition of the organosilane vapor on the substrate. For example, prior to deposition, the substrate may have a first plurality of individually addressable locations, and subsequent to deposition, the substrate may have a second plurality of individually addressable locations that may or may not vary in size, location, pattern, and/or other properties from the first plurality of individually addressable locations.
Substrate Composition A substrate surface may comprise the surface of any substrate. The substrate may be an open substrate. The substrate may be substantially planar. The substrate may be textured and/or patterned. In some cases, the texture and/or pattern of the substrate can distinguish individually addressable locations, where individually addressable locations comprise functionalized locations to which reagents or analytes may be localized on the substrate, as described elsewhere herein. Substrates that can be used for the generation of functionalized regions are described in detail in U.S. Patent Pub. No. 2021/0079464, which is entirely incorporated herein by reference for all purposes.

A substrate may be a solid substrate. The substrate may entirely or partially comprise one or more of rubber, glass, silicon, a metal such as aluminum, copper, titanium, chromium, or steel, a ceramic such as titanium oxide or silicon nitride, a plastic such as polyethylene (PE), low-density polyethylene (LDPE), high-density polyethylene (HDPE), polypropylene (PP), polystyrene (PS), high impact polystyrene (HIPS), polyvinyl chloride (PVC), polyvinylidene chloride (PVDC), acrylonitrile butadiene styrene (ABS), polyacetylene, polyamides, polycarbonates, polyesters, polyurethanes, polyepoxide, polymethyl methacrylate (PMMA), polytetrafluoroethylene (PTFE), phenol formaldehyde (PF), melamine formaldehyde (MF), urea-formaldehyde (UF), polyetheretherketone (PEEK), polyetherimide (PEI), polyimides, polylactic acid (PLA), furans, silicones, polysulfones, any mixture of any of the preceding materials, or any other appropriate material. The substrate may be entirely or partially coated with one or more layers of a metal such as aluminum, copper, silver, or gold, an oxide such as a silicon oxide ($Si_xO_y$, where x, y may take on any possible values), a photoresist such as SU8, a surface coating such as an aminosilane or hydrogel, polyacrylic acid, polyacrylamide dextran, polyethylene glycol (PEG), or any combination of any of the preceding materials, or any other appropriate coating.

A substrate may be fully or partially opaque to visible light. In some cases, a substrate may be at least 5%, 10%, 15%, 20%, 25%, 30%, 35%, 40%, 45%, 50%, 55%, 60%, 65%, 70%, 75%, 80%, 85%, 90%, 95%, 96%, 97%, 98%, 99%, 99.5%, or 100% opaque to visible light. A substrate may be fully or partially transparent to visible light. In some cases, a substrate may be at least 5%, 10%, 15%, 20%, 25%, 30%, 35%, 40%, 45%, 50%, 55%, 60%, 65%, 70%, 75%, 80%, 85%, 90%, 95%, 96%, 97%, 98%, 99%, 99.5%, or 100% transparent to visible light. The one or more layers of the substrate may have a thickness of at least 1 nanometer (nm), 2 nm, 5 nm, 10 nm, 20 nm, 50 nm, 100 nm, 200 nm, 500 nm, 1 micrometer (μm), 2 μm, 5 μm, 10 μm, 20 μm, 50 μm, 100 μm, 200 μm, 500 μm, or 1 millimeter (mm). In some cases, a first layer may have a first thickness, and a second layer may have a second thickness. In some cases the first thickness is different from the second thickness. In some cases the first thickness and the second thickness are the same. A surface of the substrate may be modified to comprise any of the binders or linkers described herein. A surface of the substrate may be modified to comprise active chemical groups, such as amines, esters, hydroxyls, epoxides, and the like, or a combination thereof. In some instances, such binders, linkers, active chemical groups, and the like may be added as an additional layer or coating to the substrate.

The substrate may have the general form of a cylinder, a cylindrical shell or disk, a rectangular prism, or any other geometric form. The substrate may have a thickness (e.g., a minimum dimension) of at least 100 μm, 200 μm, 500 μm, 1 mm, 2 mm, 5 mm, 10 mm, or more. The substrate may have a first lateral dimension (such as a width for a substrate having the general form of a rectangular prism or a radius for a substrate having the general form of a cylinder) of at least 1 mm, 2 mm, 5 mm, 10 mm, 20 mm, 50 mm, 100 mm, 200 mm, 500 mm, 1,000 mm, or more. The substrate may have a second lateral dimension (such as a length for a substrate having the general form of a rectangular prism) or at least 1 mm, 2 mm, 5 mm, 10 mm, 20 mm, 50 mm, 100 mm, 200 mm, 500 mm, 1,000 mm, or more.

A surface of the substrate may be planar. The surface of the substrate may be substantially planar. Substantially planar may refer to planarity at a micrometer level (e.g., a range of unevenness on the planar surface does not exceed the micrometer scale) or nanometer level (e.g., a range of unevenness on the planar surface does not exceed the nanometer scale). Alternatively, substantially planar may refer to planarity at less than a nanometer level or greater than a micrometer level (e.g., millimeter level). A surface of the substrate may be uncovered and may be exposed to an atmosphere. Alternatively, or in addition, a surface of the substrate may be textured or patterned. For example, the substrate may comprise grooves, troughs, hills, and/or pillars. The substrate may define one or more cavities (e.g., micro-scale cavities or nano-scale cavities). The substrate may define one or more channels. The substrate may have regular textures and/or patterns across the surface of the substrate. For example, the substrate may have regular geometric structures (e.g., wedges, cuboids, cylinders, spheroids, hemispheres, etc.) above or below a reference level of the surface. Alternatively, the substrate may have irregular textures and/or patterns across the surface of the substrate. For example, the substrate may have any arbitrary structure above or below a reference level of the substrate. In some instances, a texture of the substrate may comprise structures having a maximum dimension of at most about 100%, 90%, 80%, 70%, 60%, 50%, 40%, 30%, 20%, 10%, 9%, 8%, 7%, 6%, 5%, 4%, 3%, 2%, 1%, 0.1%, 0.01%, 0.001%, 0.0001%, 0.00001% of the total thickness of the substrate or a layer of the substrate. In some instances, the textures and/or patterns of the substrate may define at least part of an individually addressable location on the substrate. A textured and/or patterned substrate may be substantially planar.

FIGS. 1A-1G illustrate different examples of cross-sectional surface profiles of substrates in accordance with methods described herein. FIG. 1A illustrates a cross-sectional surface profile of a substrate having a completely planar surface. FIG. 1B illustrates a cross-sectional surface profile of a substrate having semi-spherical troughs or grooves. FIG. 1C illustrates a cross-sectional surface profile of a substrate having pillars, or alternatively or in conjunction, wells. FIG. 1D illustrates a cross-sectional surface profile of a substrate having a coating. FIG. 1E illustrates a cross-sectional surface profile of a substrate having spherical particles. FIG. 1F illustrates a cross-sectional surface profile of FIG. 1B, with a first type of binders seeded or associated with the respective grooves. FIG. 1G illustrates a cross-sectional surface profile of FIG. 1B, with a second type of binders seeded or associated with the respective grooves.

The substrate may be configured to move in any vector with respect to a reference point. In some instances, the systems, devices, and apparatus described herein may further comprise a motion unit configured to move the substrate. The substrate may be configured to move with any velocity and/or acceleration. In some cases, a solution may be dispensed on the substrate while the substrate is stationary; the substrate may then be subjected to rotation (or other motion) following the dispensing of the solution. Alternatively, the substrate may be subjected to rotation (or other motion) prior to the dispensing of a solution; the solution may then be dispensed on the substrate while the substrate is rotating (or otherwise moving).

Figure 5:
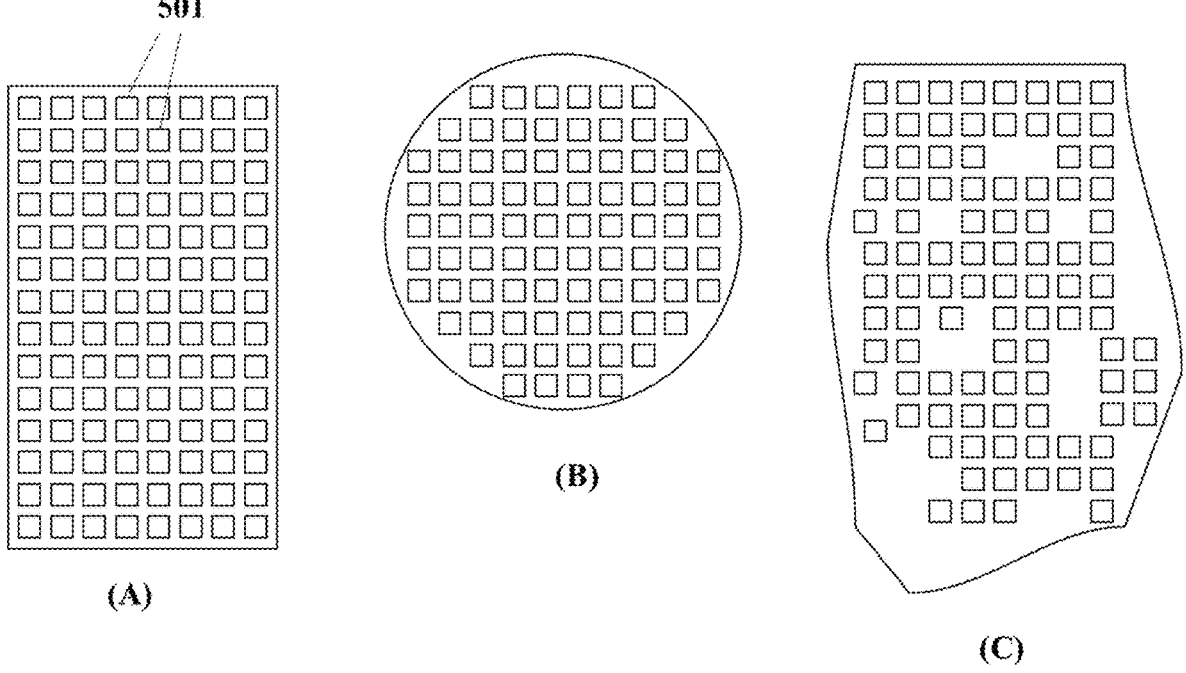
FIG. 5 illustrates example individually addressable locations on different substrates.

The substrate may comprise an array. For instance, the array may be located on a lateral surface of the substrate. The array may be a planar array. The array may have the general shape of a circle, annulus, rectangle, or any other shape. The array may comprise linear and/or non-linear rows. The array may be evenly spaced or distributed. Example arrays are illustrated in FIG. 5. The array may be arbitrarily spaced or distributed. The array may have regular spacing. The array may have irregular spacing. The array may be a textured array. The array may be a patterned array. The array may comprise a plurality of individually addressable locations. The individually addressable locations may be arranged in any convenient pattern. For example, the individually addressable locations may be randomly oriented on the array. The plurality of individually addressable locations may form separate radial regions around a disk-shaped substrate. The plurality of individually addressable locations may form a square, rectangle, disc, circular, annulus, pentagonal, hexagonal, heptagonal, octagonal, array, or any other pattern. One or more types of individually addressable locations may be generated. The types of individually addressable locations may be arrayed in any useful pattern, such as a square, rectangle, disc, annulus, pentagon, hexagon, radial pattern, etc. In some cases, the two types of individually addressable locations may have different chemical, physical, and/or biological properties (e.g., hydrophobicity, charge, color, topography, size, dimensions, geometry, etc.). For example, a first type of individually addressable location may bind a first type of biological analyte but not a second type of biological analyte, and a second type of individually addressable location may bind the second type of biological analyte but not the first type of biological analyte.

The array may be coated with binders. For instance, the array may be randomly coated with binders. Alternatively, the array may be coated with binders arranged in a regular pattern (e.g., in linear arrays, radial arrays, hexagonal arrays etc.). The array may be coated with binders on at least 10%, 20%, 30%, 40%, 50%, 60%, 70%, 80%, 90%, 91%, 92%, 93%, 94%, 95%, 96%, 97%, 98%, or 99% of the number of individually addressable locations, or of the surface area of the substrate. The binders may be integral to the array. The binders may be added to the array. For instance, the binders may be added to the array as one or more coating layers on the array.

The binders may be configured to immobilize analytes or reagents, such as through non-specific interactions, such as one or more of hydrophilic interactions, hydrophobic interactions, electrostatic interactions, physical interactions (e.g., adhesion to pillars or settling within wells), and the like. The binders may immobilize analytes or reagents through specific interactions. For instance, where the analyte or reagent is a nucleic acid molecule, the binders may comprise oligonucleotide adaptors configured to bind to the nucleic acid molecule. Alternatively, or in addition, for example in cases where other types of analytes or reagents are to be immobilized, the binders may comprise one or more of antibodies, oligonucleotides, nucleic acid molecules, aptamers, affinity binding proteins, lipids, carbohydrates, and the like. The binders may immobilize analytes or reagents through any possible combination of interactions. For instance, the binders may immobilize nucleic acid molecules through a combination of physical and chemical interactions, through a combination of protein and nucleic acid interactions, etc. The array may comprise an order of magnitude of at least about 10, 100, $10^3$, $10^4$, $10^5$, $10^6$, $10^7$, $10^8$, $10^9$, $10^{10}$, $10^{11}$, or more binders. Alternatively, or in addition, the array may comprise an order of magnitude of at most about $10^{11}$, $10^{10}$, $10^9$, $10^8$, $10^7$, $10^6$, $10^5$, $10^4$, $10^3$, 100, 10 or fewer binders. In some instances, a single binder may bind a single analyte (e.g., nucleic acid molecule) or single reagent. In some instances, a single binder may bind a plurality of analytes (e.g., plurality of nucleic acid molecules) or a plurality of reagents. In some instances, a plurality of binders may bind a single analyte or a single reagent. Though examples herein describe interactions of binders with nucleic acid molecules, the binders may immobilize other molecules (such as proteins), other particles, cells, viruses, other organisms, or the like. Though examples herein describe interactions of binders with samples or analytes, the binders may similarly immobilize reagents.

In some instances, the array may comprise a plurality of types of binders. For example, the array may comprise different types of binders to bind different types of analytes or reagents. For example, the array may comprise a first type of binders (e.g., oligonucleotides) configured to bind a first type of analyte (e.g., nucleic acid molecules) or reagent, and a second type of binders (e.g., antibodies) configured to bind a second type of analyte (e.g., proteins) or reagent, and the like. In another example, the array may comprise a first type of binders (e.g., first type of oligonucleotide molecules) to bind a first type of nucleic acid molecules and a second type of binders (e.g., second type of oligonucleotide molecules) to bind a second type of nucleic acid molecules, and the like. For example, the substrate may be configured to bind different types of analytes or reagents in certain fractions or specific locations on the substrate by having the different types of binders in the certain fractions or specific locations on the substrate.

Individually Addressable Locations on a Substrate

The substrate surface may comprise any number (i.e., a plurality) of individually addressable locations (e.g., in an array as described herein). The plurality of individually addressable locations may be arranged as an array on the substrate. The plurality of individually addressable locations may be otherwise arranged, such as randomly or in any order, on the substrate, as illustrated in FIG. 5. Each of the plurality of individually addressable locations, or each of a subset of such locations, may be capable of immobilizing thereto an analyte (e.g., a nucleic acid molecule, a protein molecule, a carbohydrate molecule, etc.), a plurality of analytes, a reagent (e.g., a nucleic acid molecule, a probe molecule, a barcode molecule, an antibody molecule, a primer molecule, a bead, etc.), or a plurality of reagents. For example, an analyte or reagent may be immobilized to an individually addressable location via a support, such as a bead. Such individually addressable locations may define the regions which are to be functionalized.

An array may have any number of individually addressable locations. For instance, the array may have at least 1, 2, 5, 10, 20, 50, 100, 200, 500, 1,000, 2,000, 5,000, 10,000, 20,000, 50,000, 100,000, 200,000, 500,000, 1,000,000, 2,000,000, 5,000,000, 10,000,000, 20,000,000, 50,000,000, 100,000,000, 200,000,000, 500,000,000, 1,000,000,000, 2,000,000,000, 5,000,000,000, 10,000,000,000, 20,000,000,000, 50,000,000,000, 100,000,000,000, or more individually addressable locations. Each individually addressable location may be digitally and/or physically accessible individually (from the plurality of individually addressable locations). For example, each individually addressable location may be located, identified, and/or accessed electronically or digitally for mapping, sensing, associating with a device (e.g., detector, processor, dispenser, etc.), or otherwise processing. As described elsewhere herein, each individually addressable location may be indexed. Alternatively, the substrate may be indexed such that each individually addressable location may be identified during at least one step of the process. Alternatively or in addition, each individually addressable location may be located, identified, and/or accessed physically, such as for physical manipulation or extraction of an analyte, reagent, particle, or other component located at an individually addressable location. In some instances, each individually addressable locations may have or be coupled to a binder, as described herein, to immobilize an analyte thereto. In some instances, only a fraction of the individually addressable locations may have or be coupled to a binder. In some instances, an individually addressable location may have or be coupled to a plurality of binders to immobilize an analyte or reagent thereto.

The individually addressable locations may comprise locations of analytes or groups of analytes that are accessible for manipulation (e.g., as part of systems and methods for processing analytes). The manipulation may comprise placement, extraction, reagent dispensing, seeding, heating, cooling, or agitation. The manipulation may be accomplished through, for example, localized microfluidic, pipet, optical, laser, acoustic, magnetic, and/or electromagnetic interactions with the analyte or its surroundings.

Each individually addressable location may have the general shape or form of a circle, pit, bump, rectangle, or any other shape or form. An individually addressable location of a plurality of locations (e.g., alternating locations) may have an area. In some cases, a location may have an area of about 0.1 square micron ($\mu m^2$), 0.2 $\mu m^2$, 0.25 $\mu m^2$, 0.3 $\mu m^2$, 0.4 $\mu m^2$, 0.5 $\mu m^2$, 0.6 $\mu m^2$, 0.7 $\mu m^2$, 0.8 $\mu m^2$, 0.9 $\mu m^2$, 1 $\mu m^2$, 1.1 $\mu m^2$, 1.2 $\mu m^2$, 1.25 $\mu m^2$, 1.3 $\mu m^2$, 1.4 $\mu m^2$, 1.5 $\mu m^2$, 1.6 $\mu m^2$, 1.7 $\mu m^2$, 1.75 $\mu m^2$, 1.8 $\mu m^2$, 1.9 $\mu m^2$, 2 $\mu m^2$, 2.25 $\mu m^2$, 2.5 $\mu m^2$, 2.75 $\mu m^2$, 3 $\mu m^2$, 3.25 $\mu m^2$, 3.5 $\mu m^2$, 3.75 $\mu m^2$, 4 $\mu m^2$, 4.25 $\mu m^2$, 4.5 $\mu m^2$, 4.75 $\mu m^2$, 5 $\mu m^2$, 5.5 $\mu m^2$, or 6 $\mu m^2$. A location may have an area that is less than about 0.1 $\mu m^2$ or greater than about 6 $\mu m^2$. In some cases, a location may have a width of about 0.1 micron ($\mu m$), 0.2 $\mu m$, 0.25 $\mu m$, 0.3 $\mu m$, 0.4 $\mu m$, 0.5 $\mu m$, 0.6 $\mu m$, 0.7 $\mu m$, 0.8 $\mu m$, 0.9 $\mu m$, 1 $\mu m$, 1.1 $\mu m$, 1.2 $\mu m$, 1.25 $\mu m$, 1.3 $\mu m$, 1.4 $\mu m$, 1.5 $\mu m$, 1.6 $\mu m$, 1.7 $\mu m$, 1.75 $\mu m$, 1.8 $\mu m$, 1.9 $\mu m$, 2 $\mu m$, 2.25 $\mu m$, 2.5 $\mu m$, 2.75 $\mu m$, 3 $\mu m$, 3.25 $\mu m$, 3.5 $\mu m$, 3.75 $\mu m$, 4 $\mu m$, 4.25 $\mu m$, 4.5 $\mu m$, 4.75 $\mu m$, 5 $\mu m$, 5.5 $\mu m$, or 6 $\mu m$. A location may have a width that is less than about 0.1 $\mu m$ or greater than about 6 $\mu m$. Each individually addressable location may have a first lateral dimension (such as a radius for individually addressable locations having the general shape of a circle or a width for individually addressable locations having the general shape of a rectangle). In some cases, a first lateral dimension of a location may be at least 1 nanometer (nm), 2 nm, 5 nm, 10 nm, 20 nm, 50 nm, 100 nm, 200 nm, 500 nm, 1,000 nm, 2,000 nm, 5,000 nm, or 10,000 nm. Each individually addressable location may have a second lateral dimension (such as a length or width for individually addressable locations having the general shape of a rectangle). The second lateral dimension may be at least 1 nanometer (nm), 2 nm, 5 nm, 10 nm, 20 nm, 50 nm, 100 nm, 200 nm, 500 nm, 1,000 nm, 2,000 nm, 5,000 nm, or 10,000 nm.

In some cases, the individually addressable locations (e.g., of a same type) may be distributed on a substrate with a pitch, where the pitch is determined by the distance between the center of a first individually addressable location and the center of a closest or neighboring individually addressable location (e.g., of the same type). Individually addressable locations may be spaced with a pitch of about 0.1 micron ($\mu m$), 0.2 $\mu m$, 0.25 $\mu m$, 0.3 $\mu m$, 0.4 $\mu m$, 0.5 $\mu m$, 0.6 $\mu m$, 0.7 $\mu m$, 0.8 $\mu m$, 0.9 $\mu m$, 1$\mu$, 1.1$\mu$, 1.2$\mu$, 1.25$\mu$, 1.3 $\mu m$, 1.4 $\mu m$, 1.5$\mu$, 1.6 $\mu m$, 1.7 $\mu m$, 1.75 $\mu m$, 1.8 $\mu m$, 1.9 $\mu m$, 2 $\mu m$, 2.25 $\mu m$, 2.5 $\mu m$, 2.75 $\mu m$, 3 $\mu m$, 3.25 $\mu m$, 3.5 $\mu m$, 3.75$\mu$, 4$\mu$, 4.25$\mu$, 4.5$\mu$, 4.75$\mu$, 5$\mu$, 5.5$\mu$, 6$\mu$, 6.5 $\mu m$, 7 $\mu m$, 7.5$\mu$, 8$\mu$, 8.5 $\mu m$, 9 $\mu m$, 9.5 $\mu m$, or 10 $\mu m$. The individually addressable locations may be positioned with a pitch of less than about 0.1 $\mu m$ or greater than about 10 $\mu m$. In some cases, the pitch between any two individually addressable locations of the same type may be determined as a function of a size of a loading object (e.g., a bead). For example, where the loading object is a bead having a maximum diameter, the pitch may be at least about the maximum diameter of the loading object.

In some instances, each location, or a subset of such locations, may have immobilized thereto an analyte (e.g., a nucleic acid molecule, a protein molecule, a carbohydrate molecule, etc.) or reagent. In other instances, a fraction of the plurality of individually addressable location may have immobilized thereto an analyte or reagent. A plurality of analytes or reagents immobilized to the substrate may be copies of a template analyte or template reagent. For example, the plurality of analytes (e.g., nucleic acid molecules) or reagents may have sequence homology. In other instances, the plurality of analytes or reagents immobilized to the substrate may not be copies. The plurality of analytes may be of the same type of analyte (e.g., a nucleic acid molecule) or reagent or may be a combination of different types of analytes or reagents (e.g., nucleic acid molecules, protein molecules, etc.).

In some instances, each location, or a subset of such locations, may have immobilized thereto an analyte (e.g., a nucleic acid molecule, a protein molecule, a carbohydrate molecule, etc.) or reagent. In other instances, a fraction of the plurality of individually addressable location may have immobilized thereto an analyte or reagent. A plurality of analytes or reagents immobilized to the substrate may be copies of a template analyte or template reagent. For example, the plurality of analytes (e.g., nucleic acid molecules) or reagents may have sequence homology. In other instances, the plurality of analytes or reagents immobilized to the substrate may not be copies. The plurality of analytes may be of the same type of analyte (e.g., a nucleic acid molecule) or reagent or may be a combination of different types of analytes or reagents (e.g., nucleic acid molecules, protein molecules, etc.).

In some cases, the individually addressable locations may be indexed, e.g., spatially, such that the analyte immobilized or coupled to each individually addressable location may be identified from a plurality of analytes immobilized to other individually addressable locations. For example, data corresponding to an indexed location, collected over multiple periods of time, may be linked to the same indexed location. As will be appreciated, a combination of positive demarcations and negative demarcations (i.e., a lack thereof) may be used to index the individually addressable locations. In some embodiments, one or more reference objects (e.g., a reference bead that always emits a detectable signal during detection) are immobilized to any such location(s) on the substrate, and the individually addressable locations are indexed with reference to the reference object. In some instances, a single reference point or axis (e.g., single demarcation) may be used to index all individually addressable locations. In some embodiments, each of the individually addressable locations is indexed. In some embodiments, a subset of the individually addressable locations is indexed. In some embodiments, the individually addressable locations are not indexed, and a different region of the substrate is indexed.

Figure 2A:
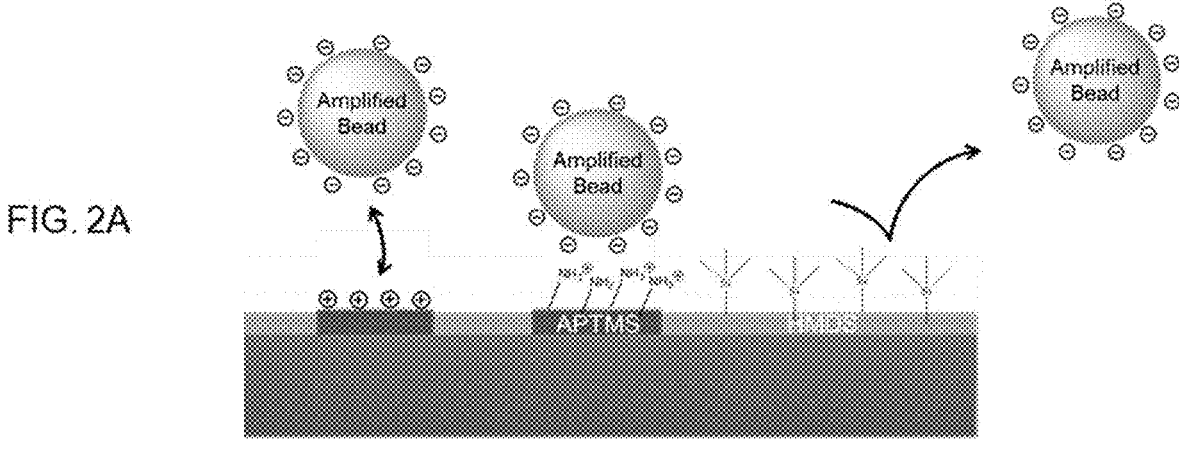
FIGS. 2A-2B illustrate methods for loading beads onto a substrate.

In some cases, an individually addressable location may comprise a distinct surface chemistry. The distinct surface chemistry may distinguish between different addressable locations. The distinct surface chemistry may distinguish between different regions on the substrate. For example, a first location has a first affinity towards an object (e.g., a bead comprising nucleic acid molecules, e.g., amplicons, immobilized thereto) and a second location has a second, different affinity towards the object due to the distinct surface chemistries. The first location and the second location may or may not be located in the same region. The first location and the second location may or may not be disposed on the surface in alternating fashion. In another example, a first region (e.g., comprising a plurality of individually addressable locations) has a first affinity towards an object and a second region has a second, different affinity towards the object due to the distinct surface chemistries. A first location type or region type may comprise a first surface chemistry, and a second location type or region type may comprise a second surface chemistry. In some cases, a third location type or region type may comprise a third surface chemistry. For example, a first location type or region type may comprise a positively charged surface chemistry and/or a hydrophobic surface chemistry, and a second location type or region type may comprise a negatively charged surface chemistry and/or a hydrophilic surface chemistry, as shown in FIG. 2A.

The analytes bound to the individually addressable locations may include, but are not limited to, molecules, cells, tissues, organisms, nucleic acid molecules, nucleic acid colonies, beads, clusters, polonies, DNA nanoballs, or any combination thereof (e.g., bead having attached thereto one or more nucleic acid molecules, e.g., one or more clonal populations of nucleic acid molecules). The analytes bound to the individually addressable locations may include any analyte described herein. The bound analytes may be immobilized to the array in a regular, patterned, periodic, random, or pseudo-random configuration, or any other spatial arrangement. In some embodiments, the analytes are bound to bead(s) which may then associate with or be immobilized to the substrate or regions of the substrate (e.g., individually addressable locations). In some embodiments, the analytes comprise a bead or a plurality of beads. In some cases, the bead or plurality of beads may comprise another analyte (e.g., nucleic acid molecule) or a clonal population of other analytes (e.g., a nucleic acid molecule that has been amplified on the bead). Such other analytes may be attached or otherwise coupled to the bead. For example, an analyte may comprise a plurality of beads, each bead having a clonal population of nucleic acid molecules attached thereto. In some cases, the bead is magnetic, and application of a magnetic field or using a magnet may be used to direct the analytes or beads comprising the analytes to the individually addressable locations. In some cases, the bead is electrically charged, and application of an electric field may be used to direct the analytes or beads comprising the analytes to the individually addressable locations. In some cases, a fluid may be used to direct the analyte to the individually addressable locations. The fluid may be a ferrofluid, and a magnet may be used to direct the fluid to the individually addressable locations. The individually addressable locations may alternatively or in conjunction comprise a material that is sensitive to a stimulus, e.g., thermal, chemical, or electrical or magnetic stimulus. For example, the individually addressable location may comprise a photo-sensitive polymer or reagent that is activated when exposed to electromagnetic radiation. In some cases, a caged molecule may be used to reveal binding (e.g., biotin) moieties (e.g., binders) on the substrate. Subsequent exposure to a particular wavelength of light may result in un-caging of the binding moieties. A bead, e.g., with streptavidin, comprising the analyte may then associate with the uncaged binding moieties. In some cases, a subset of the individually addressable locations may not contain beads. In such cases, blank beads may be added to the substrate. The blank beads may then occupy the regions that are unoccupied by an analyte. In some cases, the blank beads have a higher binding affinity or avidity for the individually addressable locations than the beads comprising the analyte. In some cases, unoccupied locations, or binders at such locations, may be destroyed or rendered inactive. In some cases, unoccupied locations may be subjected to a process to remove any unbound analyte, e.g., aspiration, washing, air blasting etc. In some cases, the sample comprising the analyte may be loaded onto the substrate using a device, e.g., a microfluidic device, closed flow cell, etc. The loaded analyte may then associate with or be immobilized to the substrate or the individually addressable locations of the substrate. Though examples herein describe immobilization of analytes to the substrate, similar mechanisms may immobilize reagents to the substrate. For example, reagents may comprise or be coupled to bead(s).

An analyte may be bound to any number of beads. Different analytes may be bound to any number of beads. The beads may be unique (i.e., distinct from each other). Any number of unique beads may be used. For instance, an order of magnitude of at least about 10, 100, 1000, 10,000, 100,000, 1,000,000, 10,000,000, 100,000,000, 1,000,000, 000, 10,000,000,000, 100,000,000,000 or more different beads may be used. Alternatively, or in addition, an order of magnitude of at most about 100,000,000,000, 10,000,000, 000, 1,000,000,000, 100,000,000, 10,000,000, 1,000,000, 100,000, 10,000, 1000, 100, or 10 different beads may be used. A number of different beads can be within a range defined by any two of the preceding values. The beads may be distinguishable from one another using a property of the beads, such as color, reflectance, anisotropy, brightness, fluorescence, etc. As described elsewhere herein, in some cases, different beads may comprise different tags (e.g., nucleic acid sequences) coupled thereto. For example, a bead may comprise an oligonucleotide molecule comprising a tag that identifies a bead amongst a plurality of beads.

Substrate Loading

A surface comprising a plurality of individually addressable locations may be loaded with a sample comprising beads (or analytes, reagents, or any combination thereof, etc.). The beads may be loaded onto the surface at an occupancy determined by the number of locations of a given location type comprising at least one bead out of the total number of locations of the same location type. A surface comprising a plurality of locations may have occupancy of at least about 50%, 60%, 70%, 80%, 85%, 86%, 87%, 88%, 89%, 90%, 91%, 92%, 93%, 94%, 95%, 96%, 97%, 98%, 99.5%, or 100%. For example, a surface may have at least about 90% of the locations of a given location type loaded with at least one bead. Beads may land on the surface with a landing efficiency determined by the number of beads that bind to the surface out of the total number of beads dispensed on the surface. Beads may be dispensed onto a surface with a landing efficiency of at least about 10%, 20%, 30%, 40%, 50%, 55%, 60%, 65%, 70%, 75%, 80%, 90%, up to about 100%. In some embodiments, one or more of a temperature, an incubation time, a surfactant, or a salt concentration of a solution comprising beads may be adjusted to increase bead occupancy. In some embodiments, one or more of a temperature, an incubation time, a surfactant, or a salt concentration of a solution comprising beads may be adjusted to increase bead loading efficiency.

In some cases, at least about 5%, 10%, 15%, 20%, 25%, 30%, 35%, 40%, 45%, 50%, 55%, 60%, 65%, 70%, 75%, 80%, 85%, 90%, or 95% of the available surface area of a substrate may be configured to accept a bead. Where less than 100% of the available surface area loads thereon a bead (e.g., has a bead immobilized thereto), the negative space (e.g., locations in which there is no bead) may be used as a reference to identify and/or index different individually addressable locations of the positive space (e.g., locations in which there is a bead). In an example, a single individually addressable location acting in negative space is sufficient to index the entire substrate. In such an example, the single individually addressable location will always remain 'dark' during imaging, such as during sequencing, as opposed to other individually addressable locations in the positive space which will light up (e.g., fluoresce) at different points in time, due to an analyte or reagent in the positive space, such that the single individually addressable location which is always 'dark' may act as a reference against all other individually addressable locations. In other examples, multiple individually addressable locations acting in negative space may facilitate indexing of the substrate. Alternatively, or in addition, a reference bead which is always 'bright' (e.g., always fluorescing regardless of time point) may be used as a reference to identify and/or index different individually addressable locations of the positive space. In such cases, even with 100% or substantially 100% of the available surface area loaded with beads, including the reference bead, the different individually addressable locations may be identified and/or indexed.

A sample may be diluted such that the approximate occupancy of the individually addressable locations is controlled. A sample may be diluted at least or at most to a dilution of 1:1, 1:2, 1:3, 1:4, 1:5, 1:6, 1:7, 1:8, 1:9, 1:10, 1:20, 1:30, 1:40, 1:50, 1:60, 1:70, 1:80, 1:90, 1:100, 1:200, 1:300, 1:400, 1:500, 1:600, 1:700, 1:800, 1:900, 1:1000, 1:10000, 1:100000, 1:1000000, 1:10000000, 1:100000000.

Figure 2B:
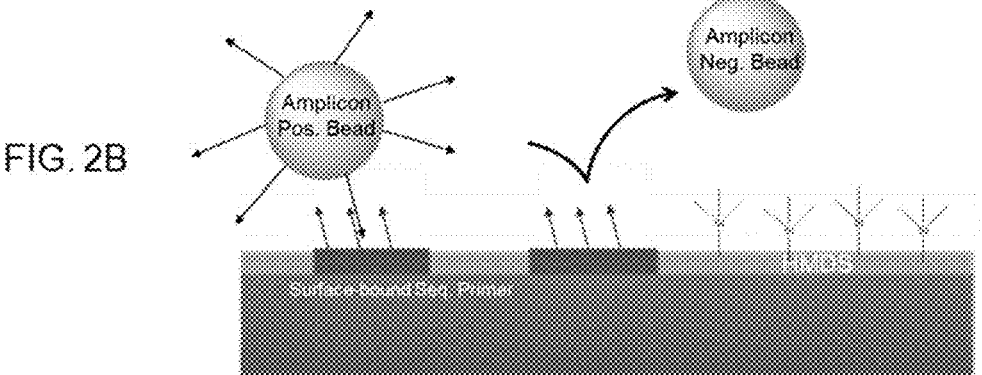
Figure 3:
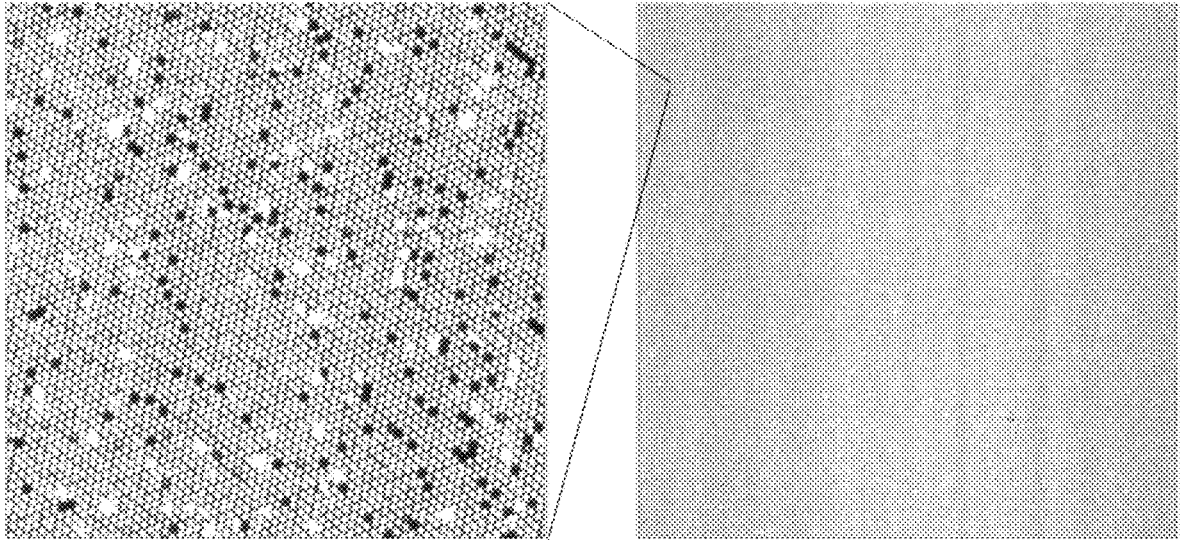
FIG. 3 shows an example coating of a substrate with a hexagonal lattice of beads.

In some instances, a sample may comprise beads. Beads may be dispersed on a surface in any pattern, or randomly. Beads may be dispersed on one or more regions (e.g., a region having a particular surface chemistry) of a surface. In some cases, beads may be dispersed on a surface or a region of a surface in a hexagonal lattice, as shown in FIG. 3, which illustrates in the right panel a zoomed out image of a portion of a surface, and in the left panel a zoomed in image of a section of the portion of the surface. In some instances, a sample comprising beads may be dispersed on a surface comprising distinct locations/regions differentiated by surface chemistry (e.g., as illustrated in FIG. 2A and FIG. 2B). For example, a sample comprising beads may be dispensed on a surface comprising positively charged locations/regions and/or hydrophobic locations/regions. The beads may have a high affinity for a first location type or region type (e.g., positively charged). The beads may have a low affinity for a second location type or region type (e.g., hydrophobic). A location may comprise no more than 1, 2, 3, 4, 5, 6, 7, 8, 9, or 10 beads per location. In some embodiments, a bead may be substantially centered within an individually addressable location when immobilized. A location may have a width that is up to about 0.5 times (×), 0.6×, 0.7×, 0.8×, 0.9×, 1×, 1.1×, 1.2×, 1.3×, 1.4×, 1.5×, 1.6×, 1.7×, 1.8×, 1.9×, 2×, 2.1×, 2.2×, 2.3×, 2.4×, 2.5×, 2.6×, 2.7×, 2.8×, 2.9×, or 3× the diameter (e.g., maximum diameter) of the bead. In some embodiments, a region may be spaced with a pitch determined by the distance between the center of a first location and the center of the closest or neighboring location of the same type. A location may be spaced with a pitch that is at least about 1×, 1.2×, 1.4×, 1.6×, 1.8×, 2×, 2.2×, 2.4×, 2.6×, 2.8×, 3×, 3.2×, 3.4×, 3.6×, 3.8×, 4×, 4.2×, 4.4×, 4.6×, 4.8×, or 5× the diameter (e.g., maximum diameter) of the bead. In some cases, one or more of a location size, a location spacing, a bead affinity, a location surface chemistry may be adjusted to reduce a deviation of a bead contact point from the center of a region. Though examples herein describe a sample comprising beads, similarly, a reagent dispensed to the substrate may comprise beads.

Figure 4A:
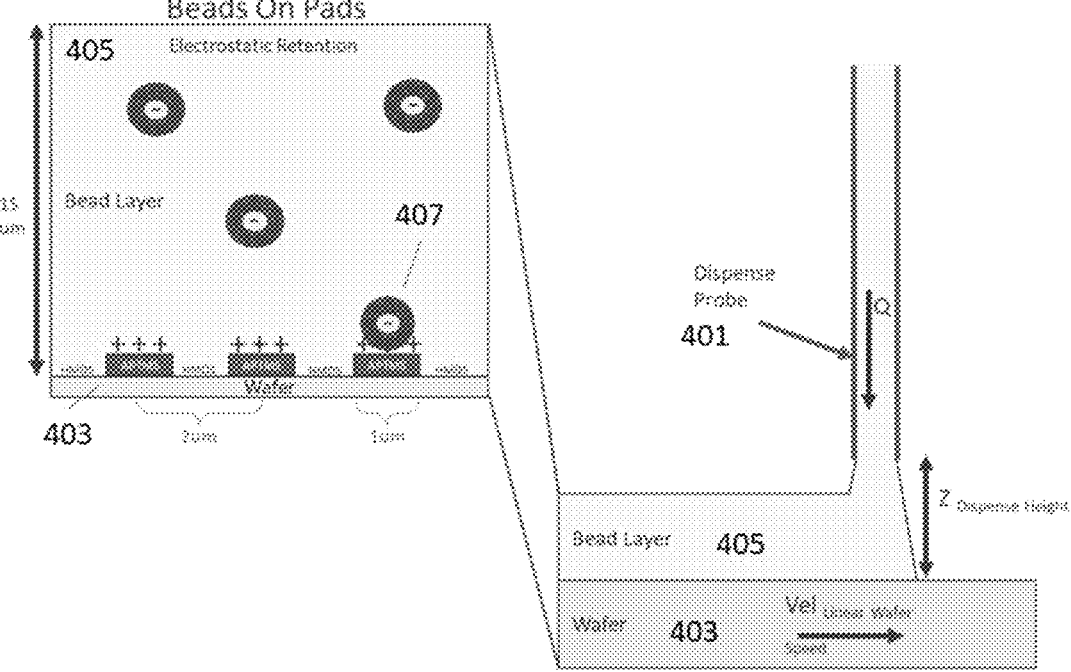
FIG. 4A shows an example system and method for loading a sample or a reagent onto a substrate.
Figure 4B:
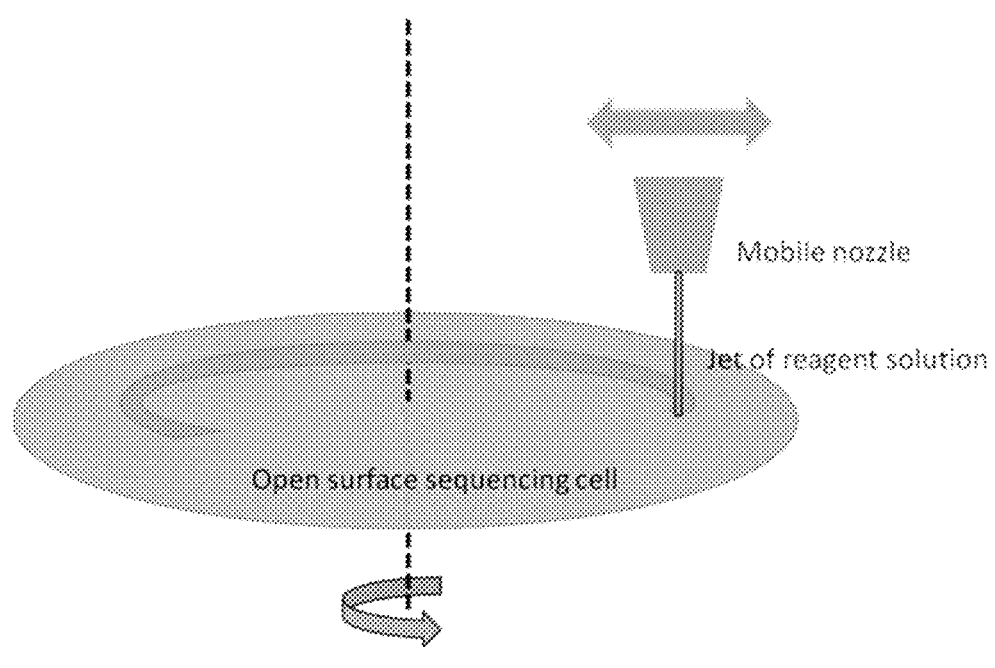
FIG. 4B shows another example system and method for loading a sample or a reagent onto a substrate.

In some cases, beads may be dispensed to the substrate according to one or more systems and methods shown in FIGS. 4A-4B. As shown in FIG. 4A, a solution comprising beads may be dispensed from a dispense probe 401 (e.g., a nozzle) to a substrate 403 (e.g., a wafer) to form a layer 405. The dispense probe may be positioned at a fixed height ("Z") above the substrate. In the illustrated example, the beads are retained in the layer 405 by electrostatic retention and may immobilize to the substrate at respective individually addressable locations. A set of beads in the solution may each comprise a population of amplified products (e.g., nucleic acid molecules) immobilized thereto, which amplified products accumulate to a negative charge on the bead with affinity to a positive charge. Otherwise, the beads may comprise reagents that have a negative charge. The substrate comprises alternating surface chemistry between distinguishable locations, in which a first location type comprises APTMS carrying a positive charge with affinity towards the negative charge of the amplified bead (e.g., a bead comprising amplified products immobilized thereto, and as distinguished from a negative bead which does not the comprise the same) or other bead comprising the negative charge, and a second location type comprises HMDS which has lower affinity and/or is repellant of the amplified bead or other bead comprising the negative charge. Within the layer 405 comprising the dispensed bead may successfully land on a first location of the first location type (as in 407). In the illustrated example, the location size is 1 micron, the pitch between the different locations of the same location type (e.g., first location type) is 2 microns, and the layer has a depth of 15 micron.

FIG. 4B illustrates a reagent (e.g., beads) being dispensed along a path on an open surface of the substrate. As shown in FIG. 4B, a reagent solution may be dispensed from a dispense probe (e.g., a nozzle). In some embodiments, a solution may be dispensed from a plurality of dispense probes. For example, a first reagent in a solution may be dispensed from a first dispense probe, a second reagent in a solution may be dispensed from a second dispense probe, and a third reagent in a solution may be dispensed from a third dispense probe. In some cases, the reagents dispensed from different dispense probes may combine on the substrate to form a homogenous or substantially homogenous solution. The dispense probe may be positioned at a fixed height above a substrate (e.g., a wafer).

The same object (e.g., a bead comprising nucleic acid molecules, e.g., amplicons, immobilized thereto) may have higher affinity towards a first location type or region type compared to a second location type or region type. The same object may be attracted towards a first location type or region type and repelled from a second location type or region type. In other examples, a first location type or region type comprising a first surface chemistry (e.g., a positively charged surface chemistry or a negatively charged surface chemistry) may interact with (e.g., have an affinity towards) a first sample type (e.g., a bead comprising nucleic acid molecules, e.g., amplicons, immobilized thereto) and exclude a second sample type (e.g., a bead lacking nucleic acid molecules, e.g., amplicons, immobilized thereto, e.g., entirely or in substantial volume), for example as illustrated in FIG. 2B. In some cases, a surface chemistry may comprise an amine. In some cases, a surface chemistry may comprise a silane (e.g., tetramethylsilane). In some cases, the surface chemistry may comprise hexamethyldisilazane (HMDS). In some cases, the surface chemistry may comprise (3-aminopropyl)triethoxysilane (APTMS). In some cases, the surface chemistry may comprise a surface primer molecule or any oligonucleotide molecule that has any degree of affinity towards another molecule.

A variety of methods may be employed to dispense one or more solutions onto a substrate to ensure a substantially similar reaction time across an area of the substrate in contact with the one or more solutions. Non-limiting examples of dispensing methods are described in International Patent Application No. PCT/US2020/022816. Barrier systems, methods, and apparatus that can be used in the open substrate systems of the present disclosure are described in U.S. Pat. No. 10,512,911 and International Patent Application No. PCT/US2019/064916, filed Dec. 6, 2019, each of which is entirely incorporated herein by reference.

Methods of generating individually addressable locations and organosilane-functionalized locations on the substrate In some cases, the method can comprise generating the plurality of individually addressable locations on the substrate (e.g., preparatory to generating a plurality of organosilane-functionalized locations). In some instances the method comprises generating the plurality of individually addressable locations by depositing a resist on the substrate surface. Individually addressable locations may be defined by a resist. In some instances, the method can further comprise removing the resist from the substrate surface after exposing the substrate surface to a dose of organosilane vapor. In some cases, the resist (e.g., the resist comprising the individually addressable locations) can be removed from the substrate surface before exposing the substrate surface to a dose of organosilane vapor. In some cases, one or more cleaning steps may be performed before exposing the substrate surface to a dose of organosilane vapor to refine the resist definitions. The resist can be any resist known in the art. The resist may be a negative or positive resist. The resist may be a photo-curable resist. The resist may be a thermally curable resist. The resist may be applied to the substrate using methods known in the art. The applied resist may be used to create a mask on the substrate using various methods, such as photolithography methods, nanoimprint lithography (NIL), extended ultraviolet lithography (EUV), electron beam lithography, or optical lithography methods such as i-line stepper/scanner lithography, deep ultraviolet (DUV) lithography, extreme ultraviolet (EUV) lithography, and X-ray lithography.

Once the individually addressable locations are defined by the resist, the method may further comprise generating organosilane-functionalized locations on at least a subset of the individually addressable locations. In some cases, the organosilane-functionalize locations may be generated using chemical vapor deposition (CVD) methods. The CVD methods can comprise purging the CVD chamber in one or more cycles with an inert gas. The chamber may comprise or be a housing or an enclosure for the substrate, as described herein. The chamber may comprise one or more inlets and outlets (e.g., gas inlets, gas outlets, fluid inlets, fluid outlets). In some cases, the chamber may be sealed (e.g., hermetically sealed) from an external atmosphere. The chamber may contain therein the substrate during one or more processes performed during the CVD methods, such as the abovementioned gas purging.

In some cases, the pressure of the chamber may be decreased to a base pressure of at least about 0.5 millitorr (mTorr), 1 mTorr, 5 mTorr, 10 mTorr, 15 mTorr, 20 mTorr, 25 mTorr, 30 m Torr, 35 mTorr, 40 mTorr, 50 mTorr, 60 mTorr, 70 mTorr, 80 mTorr, 90 mTorr, 100 mTorr, 110 mTorr, 120 mTorr, 130 mTorr, 140 mTorr, 150 mTorr, 160 mTorr, 170 mTorr, 180 mTorr, 190 mTorr, 200 mTorr, or more. Alternatively or in addition, the pressure of the chamber may be decreased to a base pressure of at most about 200 mTorr, 190 mTorr, 180 mTorr, 170 mTorr, 160 mTorr, 150 mTorr, 140 mTorr, 130 mTorr, 120 mTorr, 110 mTorr, 100 mTorr, 90 mTorr, 80 mTorr, 70 m Torr, 60 mTorr, 50 mTorr, 40 mTorr, 35 mTorr, 30 mTorr, 25 mTorr, 20 mTorr, 15 mTorr, 10 mTorr, 5 mTorr, 1 mTorr, or less.

In some cases, methods such as plasma etching, reactive ion etching, ion milling, or wet etching methods can be utilized to clean and activate an exposed wafer surface for bonding, and may be followed by one or more cycles of purging the CVD chamber with an inert gas. An inert gas can be nitrogen, argon, helium, neon, krypton, xenon, or radon. In some such cases, the pressure of the chamber may be decreased to an atmospheric pressure of at least about 5 mTorr, 10 mTorr, 15 mTorr, 20 mTorr, 25 mTorr, 30 mTorr, 35 mTorr, 40 mTorr, 50 mTorr, 60 mTorr, 70 m Torr, 80 mTorr, 90 mTorr, 100 mTorr, 110 mTorr, 120 mTorr, 130 mTorr, 140 mTorr, 150 mTorr, 160 mTorr, 170 mTorr, 180 mTorr, 190 mTorr, 200 mTorr, or more. Alternatively or in addition, the pressure of the chamber may be decreased to an atmospheric pressure of at most about 200 m Torr, 190 mTorr, 180 mTorr, 170 mTorr, 160 mTorr, 150 mTorr, 140 mTorr, 130 mTorr, 120 mTorr, 110 mTorr, 100 mTorr, 90 m Torr, 80 mTorr, 70 mTorr, 60 mTorr, 50 m Torr, 40 m Torr, 35 mTorr, 30 mTorr, 25 mTorr, 20 mTorr, 15 mTorr, 10 mTorr, 5 mTorr, or less. Organosilane vapor (e.g., aminopropyltrimethoxysilane (APTMS) vapor) may be introduced into the chamber until the pressure of the chamber is about 5 mTorr, 10 mTorr, 15 mTorr, 20 mTorr, 25 m Torr, 30 mTorr, 35 mTorr, 40 mTorr, 50 mTorr, 60 m Torr, 70 mTorr, 80 mTorr, 90 mTorr, 100 mTorr, 120 mTorr, 150 mTorr, 170 mTorr, 200 mTorr, or more. Alternatively or in addition, the pressure of the chamber may be decreased to a pressure of at most about 200 mTorr, 190 mTorr, 180 mTorr, 170 mTorr, 160 mTorr, 150 mTorr, 140 mTorr, 130 mTorr, 120 mTorr, 110 mTorr, 100 mTorr, 90 m Torr, 80 mTorr, 70 mTorr, 60 mTorr, 50 mTorr, 40 mTorr, 35 mTorr, 30 mTorr, 25 mTorr, 20 mTorr, 15 mTorr, 10 mTorr, 5 mTorr, or less. The CVD processes described herein can be repeated one or more times. Coated wafers (e.g., substrates) may be retrieved from the CVD chamber. The resist can be removed through methods known in the art using solvents known in the art.

Figures 6A, 6B, 6C, 6D, 6E, 6F, 6G, 6H:
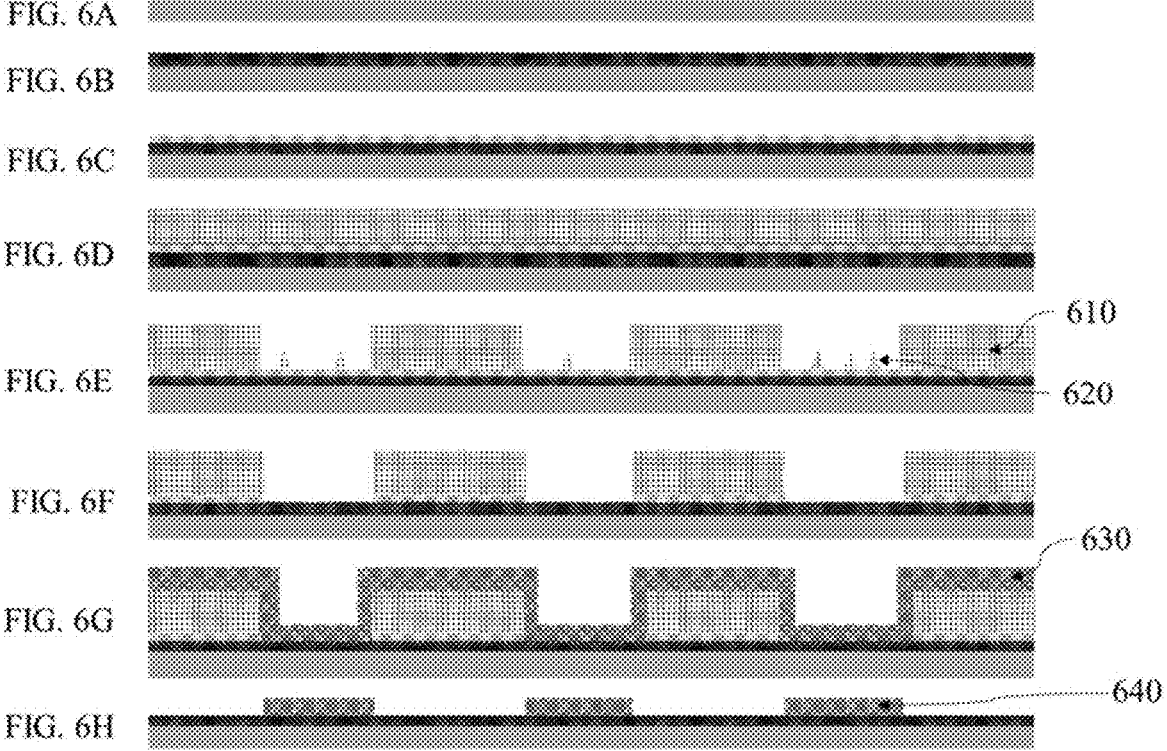
FIGS. 6A-6H illustrate a scheme by which organosilane-functionalized locations are generated through a stepper photolithography process.

In an example, as shown in FIGS. 6A-6H, the individually addressable locations may be generated by depositing and growing a silicon oxide layer (FIG. 6B) on a bare silicon wafer (FIG. 6A), followed by depositing a hexamethyldisilazane (HMDS) layer (FIG. 6C). A photoresist material may be spin-coated onto the wafer (FIG. 6D) and followed up by performing a stepper photolithography technique to generate a mask (610) (FIG. 6E). Oxygen plasma may be used to descum any remaining photoresist impurity (620) and activate the surface (FIG. 6F) and a molecular coating of an organosilane (630) can be applied through a chemical vapor deposition (CVD) process (FIG. 6G). The resist may be removed from the wafer though sonication in a stripper solution known in the art to generate a substrate surface with a plurality of organosilane-functionalized locations (640) (FIG. 6H).

Figures 7A, 7B, 7C, 7D, 7E, 7F, 7G:
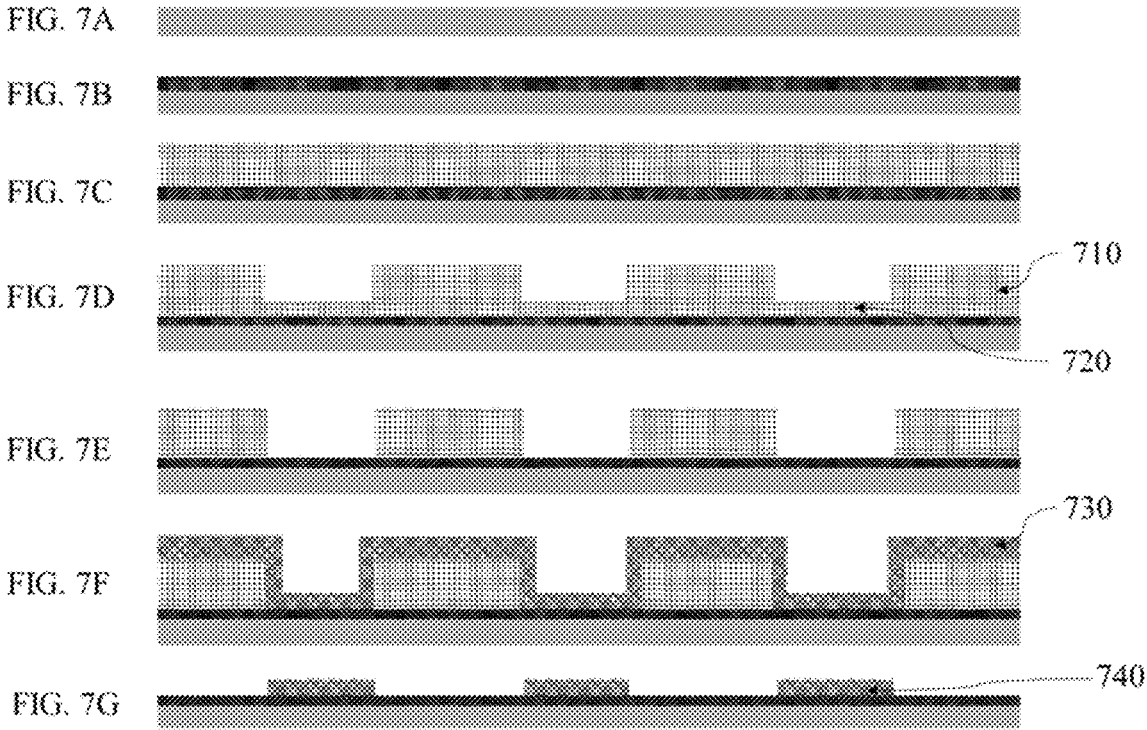
FIGS. 7A-7G illustrate a scheme by which organosilane-functionalized locations are generated through a nanoimprint lithography process.

In another example, shown in FIGS. 7A-7G, the individually addressable locations may be generated by depositing or growing a silicon oxide layer (FIG. 7B) on a bare silicon wafer (FIG. 7A). A nanoimprint lithography (NIL) photoresist material may be spin-coated onto the wafer (FIG. 7C) and followed up by imprinting and curing the resist material with a NIL stamp (710) (FIG. 7D). Oxygen plasma may be used to treat the cured resist material to remove residual layer of resist (720) and activate the surface (FIG. 7E). Molecular coating of an organosilane (730) can be applied through a CVD process (FIG. 7F), and the resist can be removed from the wafer through sonication in stripper solution known in the art to generate a substrate surface with a plurality of organosilane-functionalized locations (740) (FIG. 7G).

Figures 8A, 8B, 8C, 8D, 8E, 8F, 8G, 8H:
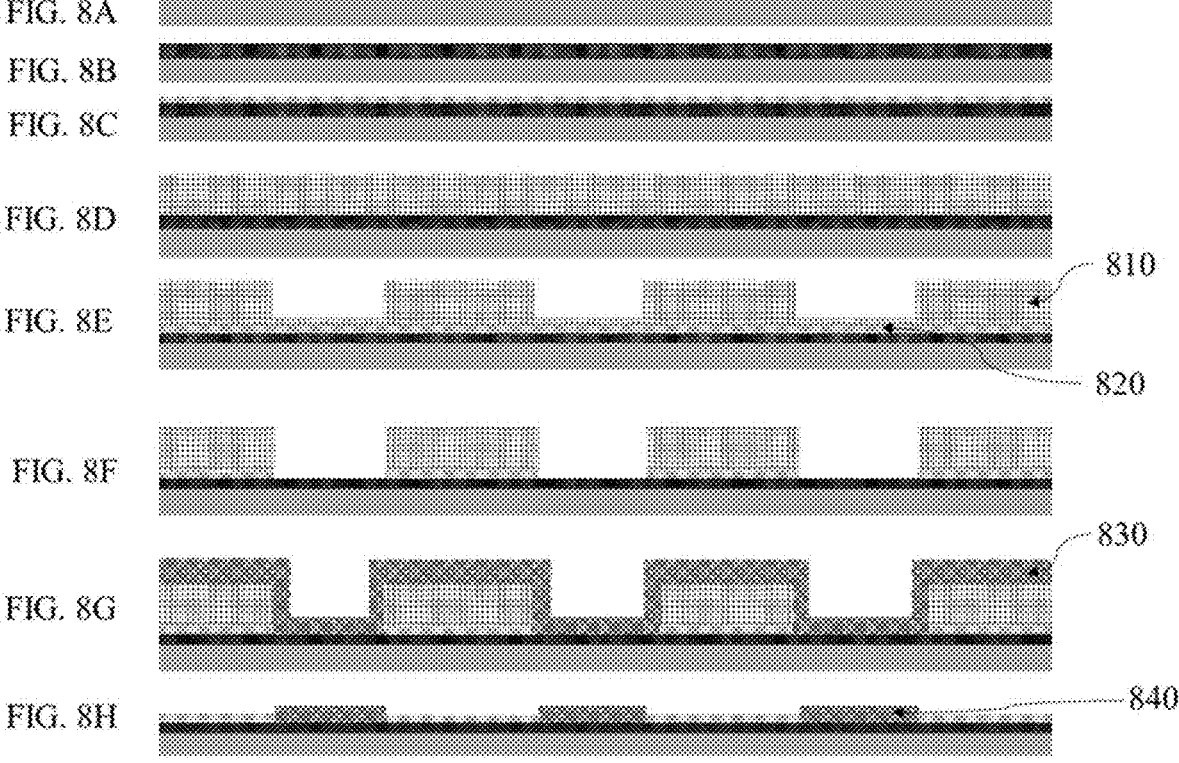
FIGS. 8A-8H illustrate a scheme by which organosilane-functionalized locations are generated through an alternative nanoimprint lithography process.

In another example, shown in FIGS. 8A-8H, the individually addressable locations may be generated by depositing and growing a silicon oxide layer (FIG. 8B) on a bare silicon wafer (FIG. 8A), followed by depositing a photoresist adhesion silane or bead passivation layer (FIG. 8C). A NIL photoresist material may be spin-coated onto the wafer (FIG. 8D) and followed by imprinting and curing the resist material with a NIL stamp (810) (FIG. 8E). Oxygen plasma may be used to treat the cured resist material to remove residual layer of resist (820) and activate the surface (FIG. 8F). Molecular coating of an organosilane (830) can be applied through a CVD process (FIG. 8G), and the resist can be removed from the wafer through sonication in stripper solution known in the art to generate a substrate surface with a plurality of organosilane-functionalized locations (840) (FIG. 8H).

An organosilane may be (3-aminopropyl)triethoxysilane (APTES), (3-aminopropyl) trimethoxysilane (APTMS), (3-chloropropyl) trimethoxysilane, (3-Glycidyloxypropyl) trimethoxysilane, (3-Mercaptopropyl) trimethoxysilane, (chloromethyl)triethoxysilane, [3-(diethylamino) propyl]trimethoxysilane, 2,4,6,8-tetramethylcyclotetrasiloxane, 3-aminopropyl(diethoxy)methylsilane, 3-cyanopropyltriethoxysilane, allyltrimethoxysilane, aminopropyldimethylethoxysilane (APDMES), bis(3-(methylamino) propyl) trimethoxysilane, chloromethyl(methyl)dimethoxysilane, diethoxydimethylsilane, diethoxydiphenylsilane, diexthoxydimethylsilane, dimethoxy(methyl) octylsilane, dimethoxymethylvinylsilane, di-n-octyldichlorosilane, diphenylsilanediol, dodecyltriethoxysilane, ethoxytrimethylsilane, hexadecyltrimethoxysilane, hexaethyldisilazane, hexamethyldisilane, hexamethyldisilazane (HMDS), hexapropyldisilazane, isobutyl(trimethoxy) silane, methoxy (dimethyl) octadecylsilane, methoxytrimethylsilane, methyltrichlorosilane, N-(2-aminoethyl)-3-aminopropyltrimethoxysilane, n-proplyltriethoxysilane, pentamethyldisilane, tetrabutyl orthosilicate, tetraethyl orthosilicate, tetraethylsilane, tetramethyl orthosilicate, tetramethylsilane, tetrapropyl orthosilicate, trichloro(dichloromethyl) silane, trichloro(hexyl) silane, trichloro(octadecyl) silane, trichloro (octyl) silane, trichloro(phenethyl) silane, trichlorocyclopentylsilane, triethoxy (octyl) silane, triethoxyphenylsilane, triethoxyvinylsilane, triethyl(octyl) silane, trimethoxy (2-phenylethyl) silane, trimethoxy (octadecyl) silane, trimethoxy (octyl) silane, trimethoxy [3-(methylamino) propyl]silane, trimethoxymethylsilane, trimethoxyphenylsilane, tris(dimethylamino) silane, tris(tert-butoxy) silanol, tris(tert-pentoxy) silanol, or vinyltrimethoxysilane. An organosilane may also be of a general structure $R_nSi(-OR')_{4-n}$, wherein R' is independently selected from $C_{1-18}$ alkyl and R is selected from $C_{1-18}$ alkyl, phenyl, or an organofunctional group. An organofunctional group may be an amine.

A dose of vapor introduced into the chamber may be an azido-silane. An azido-silane may be (azidomethyl) phenethyltrimethoxysilane, (azidomethyl)trimethylsilane, 11-azidoundecyltrimethyoxysilane, 3-azidopropyltriethoxysilane, 4-(azidosulfonyl) phenethyltrimethoxysilane, 6-azidosulfonylhexyltriethoxysilane, azidomethyl(polyethyleneoxy) propyltriethoxysilane, azidotrimethylsilane, p-azidomethylphenyltrimethoxysilane, trimethylsilyl azide, or any other silane comprising an azide group ($-N=N^+$ $=N^-$).

A dose of vapor introduced into the chamber may be a biotin-silane. A biotin-silane may be a silane containing a biotin moiety.

A relatively low dose of organosilane vapor may be provided to the substrate during any one flow of the vapor during the CVD processes described herein. Beneficially, such low dose treatments may increase control over the final properties of the functionalized locations generated on the surface. It is recognized herein that, over a course of repeated experiments, such low dose treatment methods have yielded more consistent results (e.g., properties of the functionalized locations, such as their dimensions and edge definitions) across the numerous experiments, over high dose treatment methods. The CVD processes described herein are thus highly repeatable and reliable for generation of functionalized regions on a substrate surface. Furthermore, the low dose methods described herein facilitate uniformity of one or more properties of functionalized locations generated within a single substrate, such as to yield multiple functionalized locations with low standard deviation (for a property) across the same substrate. It is further recognized that the low dose methods described herein have generated functionalized locations with beneficial parameters for downstream applications when compared to single high dose methods, such as functionalized location with a relatively low edge thickness, which facilitates downstream bead loading onto such locations.

A dose of organosilane vapor applied to the substrate may be at most about $1 \times 1019$ molecules per meter2, $1 \times 1020$ molecules/m2, $1 \times 1021$ molecules/m2, $1 \times 1022$ molecules/m2, $1 \times 1023$ molecules/m2 $1 \times 1024$ molecules/m2, $1 \times 1025$ molecules/m2, $1 \times 1026$ molecules/m2, $1 \times 1030$ molecules/m2, $1 \times 1040$ molecules/m2, or less. Alternatively, or in addition, the dose may be at least about $1 \times 1019$ molecules per m2. As used herein, the term "low dose" or "relatively low dose" used with respect to an organosilane vapor may generally refer to a dose that is at most about $1 \times 1024$ molecules/m2. A dose may be measured using the following formula:

$$D = \frac{P_s t}{\sqrt{2\pi mkT}}$$

where Ps is a pressure of the source gas (measured by Pd−Pb, where Pd is a deposition pressure and Pb is a base pressure), T is a reaction temperature, t is deposition time, m is molecular weight of vapor, and k is the Boltzmann constant.

In one example only, the following experimental conditions may be used: $k=1.38 \times 10\text{-}23$ J/K, Ps=1.99 Pascal, Pd=5.33 Pascal, Pb=3.33 Pascal, T=343.15 K, $m=1.08 \times 10\text{-}23$ kg (for APTMS), and t=283 seconds. The resulting dose, D, of APTMS, is $9.98 \times 1023$ molecules/m2.

A plurality of organosilane-functionalized regions generated on the substrate surface according to the methods described herein may have an average edge height of at least about 0.5 nanometers (nm), 0.6 nm, 0.7 nm, 0.8 nm, 0.9 nm, 1.0 nm, 1.1 nm, 1.2 nm, 1.3 nm, 1.4 nm, 1.5 nm, 1.6 nm, 1.7 nm, 1.8 nm, 1.9 nm, 2.0 nm, 2.1 nm, 2.2 nm, 2.3 nm, 2.4 nm, 2.5 nm, 2.6 nm, 2.7 nm, 2.8 nm, 2.9 nm, 3.0 nm, 3.1 nm, 3.2 nm, 3.3 nm, 3.4 nm, 3.5 nm, 3.6 nm, 3.7 nm, 3.8 nm, 3.9 nm, 4.0 nm, 4.5 nm, 5.0 nm, 5.5 nm, 6.0 nm, 6.5 nm, 7.9 nm, or more, with a standard deviation of about 0.1 nm, 0.2 nm, 0.3 nm, 0.4 nm, 0.5 nm, 0.6 nm, 0.7 nm, 0.8 nm, 0.9 nm, 1.0 nm, 1.1 nm, 1.2 nm, 1.3 nm, 1.4 nm, 1.5 nm, 1.6 nm, 1.7 nm, 1.8 nm, 1.9 nm, 2.0 nm, 2.1 nm, 2.2 nm, 2.3 nm, 2.4 nm, 2.5 nm, or more. An edge height may be defined along an axis substantially normal to a plane of the substrate surface and measure the distance between the height of a non-organosilane-functionalized location near a base of an organosilane-functionalized location and the highest point around the perimeter of an organosilane-functionalized location. An average edge height may be defined as an average of edge heights measured for a plurality of organosilane-functionalized locations. In some cases, the average edge height may include multiple edge heights measured for a single organosilane-functionalized location.

Figures 17A, 17B:
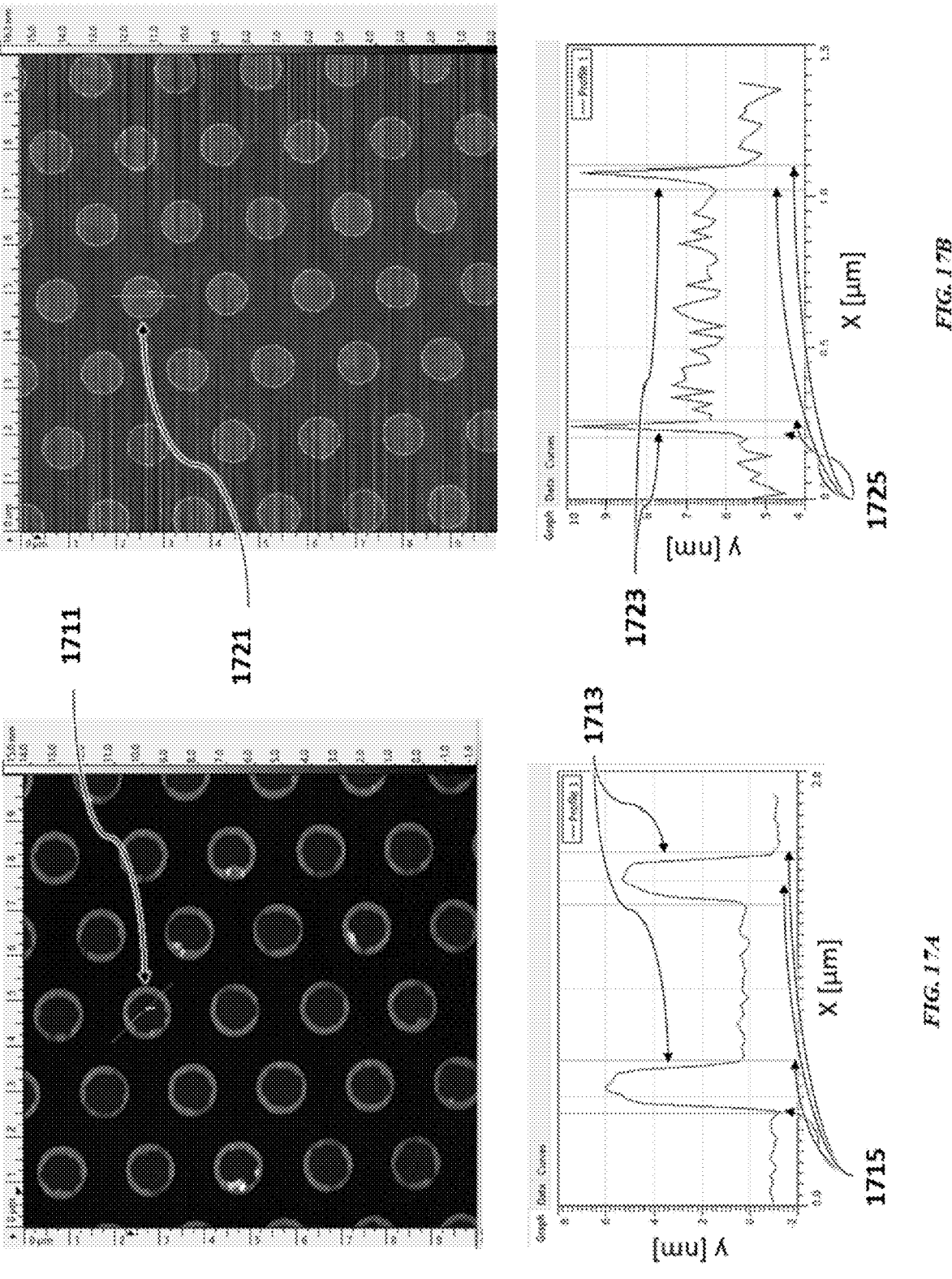
FIGS. 17A-17B show AFM images and line scan profiles for individually addressable locations generated according to different methods.

A plurality of organosilane-functionalized regions generated on the substrate surface according to the methods described herein may have an average edge thickness of at most about 0.05 nanometers (nm), 0.06 nm, 0.07 nm, 0.08 nm, 0.09 nm, 0.1 nm, 0.2 nm, 0.3 nm, 0.4 nm, 0.5 nm, 0.6 nm, 0.7 nm, 0.8 nm, 0.9 nm, 1.0 nm, 2.0 nm, 3.0 nm, 4.0 nm, 5.0 nm or more. An average edge thickness may be defined as an average of edge thicknesses measured for a plurality of organosilane-functionalized locations. In some cases, the average edge thickness may include multiple edge thicknesses measured for a single organosilane-functionalized location. An edge thickness may be defined along an axis substantially parallel to a plane of the substrate surface and measure the distance between the start and end of an edge disposed at the perimeter of a location, where the start and end of an edge lies along a same radial line from a center or approximate center of the organosilane-functionalized location. An edge of an organosilane-functionalized location, as described herein, may be a protrusion along the periphery of the organosilane-functionalized location (e.g., a raised ring) which distinguishes between an organosilane-functionalized area and non-organosilane-functionalized areas, and the edge may encompass the highest point around the perimeter of an organosilane-functionalized location. The start of an edge may be defined as the point of a non-organosilane-functionalized area nearest to the highest point around the perimeter of an organosilane-functionalized location, and the end of an edge may be defined as the point of a substantially planar organosilane-functionalized area nearest to the highest point around the perimeter of the organosilane-functionalized location. In some cases, the substantially planar organosilane-functionalized area may have a deviation of at most about 2 nm, 1.5 nm, or 1.0 nm in surface height. In an example, FIG. 17A illustrates, at the bottom, a height profile of an organosilane-functionalized location 1711 (identified in the AFM image at the top), in which the edge is represented by peaks 1713, and the two starts and two ends of the edge are denoted by four vertical lines called out by readout 1715. A relatively lower edge thickness may beneficially leave a larger substantially planar organosilane-functionalized area (near the center of the organosilane-functionalized location) exposed to be able to bind to beads in downstream applications.

An organosilane-functionalized location generated on the substrate surface according to the methods described herein may have a diameter of at most about 0.1 microns (μm), 0.2 μm, 0.3 μm, 0.4 μm, 0.5 μm, 0.6 μm, 0.7 μm, 0.8 μm, 0.9 μm, 1.0 μm, 1.2 μm, 1.5 μm, 1.7 μm, 2.0 μm, 2.2 μm, 2.5 μm, 3.0 μm, or more. A plurality of organosilane-functionalized locations may have an average diameter of about 0.1 microns (μm), 0.2 μm, 0.3 μm, 0.4 μm, 0.5 μm, 0.6 μm, 0.7 μm, 0.8 μm, 0.9 μm, 1.0 μm, 1.2 μm, 1.5 μm, 1.7 μm, 2.0 μm, 2.2 μm, 2.5 μm, 3.0 μm, or more.

A plurality of organosilane-functionalized locations generated on the substrate surface according to the methods described herein may have an average pitch (e.g., the distance between the center of a first organosilane-functionalized location and the center of a closest or neighboring organosilane-functionalized location) of about 0.1 micron (μm), 0.2 μm, 0.25 μm, 0.3μ, 0.4 μm, 0.5 μm, 0.6 μm, 0.7 μm, 0.8 μm, 0.9 μm, 1μ, 1.1μ, 1.2 μm, 1.25μ, 1.3 μm, 1.4 μm, 1.5 μm, 1.6 μm, 1.7 μm, 1.75 μm, 1.8 μm, 1.9 μm, 2.0 μm, 2.25

μm, 2.5 μm, 2.75 μm, 3 μm, 3.25 μm, 3.5 μm, 3.75 μm, 4 μm, 4.25 μm, 4.5 μm, 4.75 μm, 5 μm, 5.5 μm, 6 μm, 6.5 μm, 7 μm, 7.5 μm, 8 μm, 8.5 μm, 9 μm, 9.5 μm, 10 μm, or more. In some case the locations may be positioned with a pitch that is within a range defined by any two of the preceding values. The locations may be positioned with a pitch of less than about 0.1 μm or greater than about 10 μm. A plurality of organosilane-functionalized locations may have pitches that are not uniform or vary within a region. A pitch may be defined as distance between the respective centers of one individually addressable or organosilane-functionalized location and an adjacent individually addressable location or organosilane-functionalized location.

An organosilane-functionalized location of the plurality of organosilane-functionalized locations may be substantially elliptical, circular, octagonal, heptagonal, hexagonal, pentagonal, rectangular, square, tetragonal, or trigonal. A plurality of organosilane-functionalized locations may be arranged in a regular array. A plurality of organosilane-functionalized locations may be arranged in varying arrays in a region. A substrate may have a plurality of organosilane-functionalized locations which are arranged in at least 1 array, 2 arrays, 3 arrays, 4 arrays, 5 arrays, 6 arrays, 7 arrays, 8 arrays, 9 arrays, 10 arrays, 25 arrays, 50 arrays, 100 arrays, 200 arrays, 300 arrays, 500 arrays, or more. The average pitch of an array may be substantially uniform. Alternatively, the average pitch of an array may vary within a region. In some cases, the organosilane-functionalized location may be distributed in any pattern, or in any random fashion. The organosilane-functionalized location may have any shape. In some cases, the respective shapes of a plurality of organosilane-functionalized locations can be substantially uniform. Alternatively, the respective shapes can vary. The organosilane-functionalized location may possess other chemical and physical properties described elsewhere herein.

After a first round of exposure of the substrate surface to a dose of organosilane vapor, the method may further comprise exposing a substrate surface to one or more additional doses of organosilane vapor to generate a second plurality of organosilane-functionalized locations on the substrate, wherein the second plurality of organosilane-functionalized corresponds to at least an additional subset of the plurality of individually addressable locations. In some cases, each dose of the one or more additional doses may be at most about $1 \times 10^{24}$ molecules per m$^2$. In some cases, at least one of the additional doses may be at most $1 \times 10^{24}$ molecules per m$^2$. In some cases, a single individually addressable location may be functionalized into an organosilane-functionalized location by only one dose of the organosilane. Alternatively, a single addressable location may be functionalized into an organosilane-functionalized location by at least 2 doses, 3 doses, 4 doses, 5 doses, 6 doses, 7 doses, 8 doses, 9 doses, 10 doses, 11 doses, 12 doses, 13 doses, 14 doses, 15 doses, or more. In one or more doses, a partial amount of the individually addressable locations may be functionalized. In one or more doses, a region of individually addressable locations may be functionalized. In one or more doses, the functionalized locations may be sparse, dense, or a combination of both. In one or more doses, the functionalized locations may be in regular array, random, or a combination of both. One or more additional doses of organosilane vapor may comprise at least 2 doses, 3 doses, 4 doses, 5 doses, 6 doses, 7 doses, 8 doses, 9 doses, 10 doses, 11 doses, 12 doses, 13 doses, 14 doses, 15 doses, or more.

Where a substrate surface is treated with additional dose(s) of organosilane vapor, the additional dose(s) may be provided immediately or substantially immediately after providing a prior dose. Alternatively, an additional dose may be provided after a resting period from a prior dose. In some cases, the substrate may remain in the chamber (e.g., reaction chamber) during the resting period. In some cases, the substrate may be removed from the chamber during the resting period. In some cases, each additional dose may be provided to the substrate surface after the same resting period following each dose, or after different resting periods following each dose. In some cases, some additional dose(s) may be provided to the substrate surface after a resting period and some additional dose(s) may be provided without a resting period following the prior dose. Any single resting period may be at least about 10 seconds, 20 seconds, 30 seconds, 40 seconds, 50 second, 60 seconds, 70 seconds, 80 seconds, 90 seconds, 100 seconds, 110 seconds, 120 seconds, 130 seconds, 140 seconds, 150 seconds, 160 seconds, 170 seconds, 180 seconds, 190 seconds, 200 seconds, 210 seconds, 220 seconds, 230 seconds, 240 seconds, 250 seconds, 260 seconds, 270 seconds, 280 seconds, 290 seconds, 300 seconds, 6 minutes, 7 minutes, 8 minutes, 9 minutes, 10 minutes, 11 minutes, 12 minutes, 13 minutes, 14 minutes, 15 minutes, 16 minutes, 17 minutes, 18 minutes, 19 minutes, 20 minutes, 21 minutes, 22 minutes, 23 minutes, 24 minutes, 25 minutes, 26 minutes, 27 minutes, 28 minutes, 29 minutes, 30 minutes, 1 hour, 2 hours, 3 hours, 4 hours, 5 hours or more. Any single resting period may be at most about 10 seconds, 20 seconds, 30 seconds, 40 seconds, 50 second, 60 seconds, 70 seconds, 80 seconds, 90 seconds, 100 seconds, 110 seconds, 120 seconds, 130 seconds, 140 seconds, 150 seconds, 160 seconds, 170 seconds, 180 seconds, 190 seconds, 200 seconds, 210 seconds, 220 seconds, 230 seconds, 240 seconds, 250 seconds, 260 seconds, 270 seconds, 280 seconds, 290 seconds, 300 seconds, 6 minutes, 7 minutes, 8 minutes, 9 minutes, 10 minutes, 11 minutes, 12 minutes, 13 minutes, 14 minutes, 15 minutes, 16 minutes, 17 minutes, 18 minutes, 19 minutes, 20 minutes, 21 minutes, 22 minutes, 23 minutes, 24 minutes, 25 minutes, 26 minutes, 27 minutes, 28 minutes, 29 minutes, 30 minutes, 1 hour, 2 hours, 3 hours, 4 hours, 5 hours or less. In some cases, a total resting period (a sum total of individual resting periods between multiple doses, and optionally the resting period after the final dose) may be at least about 10 seconds, 20 seconds, 30 seconds, 40 seconds, 50 second, 60 seconds, 70 seconds, 80 seconds, 90 seconds, 100 seconds, 110 seconds, 120 seconds, 130 seconds, 140 seconds, 150 seconds, 160 seconds, 170 seconds, 180 seconds, 190 seconds, 200 seconds, 210 seconds, 220 seconds, 230 seconds, 240 seconds, 250 seconds, 260 seconds, 270 seconds, 280 seconds, 290 seconds, 300 seconds, 6 minutes, 7 minutes, 8 minutes, 9 minutes, 10 minutes, 11 minutes, 12 minutes, 13 minutes, 14 minutes, 15 minutes, 16 minutes, 17 minutes, 18 minutes, 19 minutes, 20 minutes, 21 minutes, 22 minutes, 23 minutes, 24 minutes, 25 minutes, 26 minutes, 27 minutes, 28 minutes, 29 minutes, 30 minutes, 1 hour, 2 hours, 3 hours, 4 hours, 5 hours or more. In some cases, a total resting period may be at most about 10 seconds, 20 seconds, 30 seconds, 40 seconds, 50 second, 60 seconds, 70 seconds, 80 seconds, 90 seconds, 100 seconds, 110 seconds, 120 seconds, 130 seconds, 140 seconds, 150 seconds, 160 seconds, 170 seconds, 180 seconds, 190 seconds, 200 seconds, 210 seconds, 220 seconds, 230 seconds, 240 seconds, 250 seconds, 260 seconds, 270 seconds, 280 seconds, 290 seconds, 300 seconds, 6 minutes, 7 minutes, 8 minutes, 9 minutes, 10 minutes, 11 minutes, 12 minutes, 13 minutes, 14 minutes, 15 minutes, 16 minutes, 17 minutes, 18 minutes, 19 minutes, 20 minutes, 21 minutes, 22 minutes, 23 minutes, 24 minutes, 25 minutes, 26 minutes, 27 minutes, 28 minutes, 29 minutes, 30 minutes, 1 hour, 2 hours, 3 hours, 4 hours, 5 hours or less. A single dose method may also comprise a resting period after treatment with the single dose.

One or more operations of the method may be carried out at a temperature of at least 20 degrees Celsius (C), 30° C., 40° C., 50° C., 60° C., 70° C., 80° C., 90° C., 100° C., 110° C., 120° C., 130° C., 140° C., 150° C., 160° C., 170° C., 180° C., 190° C., 200° C., 220° C., 250° C., or more. The method may be carried out at a temperature that is within a range defined by any two of the preceding values. The steps of the method may be carried out in a combination of the preceding values of temperatures. A particular step of the method may be manipulated at a temperature, while a different step of the method may be manipulated at a different temperature, defined by the preceding values of temperatures.

The CVD chamber may be held at a base pressure of 0.5 mTorr, 1 mTorr, 5 mTorr, 10 mTorr, 15 mTorr, 20 mTorr, 25 mTorr, 30 mTorr, 35 mTorr, 40 mTorr, 50 mTorr, 60 mTorr, 70 m Torr, 80 mTorr, 90 mTorr, 100 mTorr, 120 mTorr, 150 mTorr, 170 mTorr, 200 mTorr, or within a range defined by any two of the preceding values. An organosilane vapor may be introduced into a CVD chamber at a deposition pressure of about 1 mTorr, 5 mTorr, 10 mTorr, 15 mTorr, 20 mTorr, 25 mTorr, 30 mTorr, 35 mTorr, 40 mTorr, 50 mTorr, 60 mTorr, 70 mTorr, 80 mTorr, 90 mTorr, 100 mTorr, 120 mTorr, 150 mTorr, 170 mTorr, 200 mTorr, or within a range defined by any two of the preceding values.

An organosilane vapor may be introduced into the CVD chamber over the substrate for at least 0.5 second(s), 1 s, 5 s, 10 s, 15 s, 30 s, 60 s, 120 s, 180 s, 240 s, 280 s, 290 s, 300 s, 350 s, 400 s, 450 s, 500 s, 600 s, 650 s, 700 s, 750 s, 800 s, 900 s, 1000 s, 1200 s, 1500 s, or more. The organosilane vapor may be introduced into the CVD chamber over the substrate within a range defined by any two of the preceding values. An organosilane vapor may be introduced into the CVD chamber for a consecutive period of time defined by the preceding values. An organosilane vapor may be introduced into the CVD chamber in regular intervals of time, or irregular intervals of time, as defined by the preceding values.

An organosilane vapor may be introduced into the CVD chamber statically, wherein the chamber is filled with a fixed amount of organosilane vapor to react on a substrate. An organosilane vapor may be introduced into the CVD chamber dynamically, wherein the vapor is carried through the chamber using an inert gas.

Water vapor may be introduced into the CVD chamber before the introduction of an organosilane vapor. Water vapor may be introduced into the CVD chamber after the introduction of an organosilane vapor. Water vapor may be at least 50 degrees Celsius (° C.), 60° C., 70° C., 75° C., 80° C., 85° C., 90° C., 100° C., 110° C., 120° C., 130° C., 140° C., 150° C., or more. Water vapor may be introduced at least 1 milliTorr (mTorr), 5 mTorr, 10 mTorr, 20 mTorr, 30 mTorr, 40 mTorr, 50 mTorr, 100 mTorr, 125 mTorr, 150 mTorr, 175 mTorr, 200 mTorr, 225 mTorr, 250 mTorr, 275 mTorr, 300 mTorr, 325 mTorr, 350 mTorr, 400 mTorr, or more. Water vapor may be introduced into the CVD chamber over the substrate for at least 0.5 second(s), 1 s, 5 s, 10 s, 15 s, 30 s, 60 s, 120 s, 180 s, 240 s, 280 s, 290 s, 300 s, 350 s, 400 s, 450 s, 500 s, 600 s, 650 s, 700 s, 750 s, 800 s, 900 s, 1000 s, 1200 s, 1500 s, or more. In some instances, water vapor may be introduced into the CVD chamber in regular intervals of time, or irregular intervals of time, as defined by the preceding values. In some instances, water vapor may be introduced into the CVD chamber one or more times.

The substrate generated using the low dose methods described herein may advantageously have uniform edge heights (e.g., height of an edge of an organosilane-functionalized location) with a standard deviation of less than 1.0 nm, which is beneficial for downstream applications such as the ability of the substrate to reliably immobilize beads onto the organosilane-functionalized locations. In some cases, the uniform edge heights with the low standard deviation ranges from about 0.5 nm to about 3.0 nm. In some cases, the substrate generated using the low dose methods herein may advantageously offer greater refinement of the shape of an individually addressable location. In some cases, the edge crust (e.g., the difference between an edge height and the height of an internal—i.e., central-portion of an organosilane-functionalized location) of an individually addressable location is reduced or eliminated.

The method may further comprise one or more downstream operations. For example, the method may further comprise immobilizing a bead comprising a nucleic acid molecule onto an organosilane-functionalized location of the plurality of organosilane-functionalized locations. The bead can be immobilized to the organosilane-functionalized location via any method described elsewhere herein, such as an electrostatic interaction between a positive charge of the organosilane-functionalized location and a negative charge of the bead or constituent thereof. In one example, the bead can be immobilized to the organosilane-functionalized location via a chemical reaction between the organosilane-functionalized location and the bead. In one example, the bead can be immobilized to the organosilane-functionalized location via a physical interaction between the organosilane-functionalized location and the bead. In one example, the bead can be immobilized to the organosilane-functionalized location via mechanical adhesion between the organosilane-functionalized location and the bead. In one example, a bead can have a nucleic acid molecule coupled to the bead. In one example, a bead may not be immobilized to a non-organosilane-functionalized location or an individually addressable location. Features and functionality of beads are described elsewhere herein.

The method may further comprise storage of a substrate comprising organosilane-functionalized locations generated according to the methods described herein. For example, the substrate may be stored between its production and use in downstream operation (e.g., bead immobilization). In some cases, the substrate may be stored at room temperature. In some cases, a substrate may be stored at a temperature of at least about 15 degrees Celsius (C), 16° C., 17° C., 18° C., 19° C., 20° C., 21° C., 22° C., 23° C., 24° C., 25° C., 26° C., 27° C., 28° C., 29° C., 30° C., or higher. Alternatively or in addition, a substrate may be a stored at a temperature of at most about 15° C., 16° C., 17° C., 18° C., 19° C., 20° C., 21° C., 22° C., 23° C., 24° C., 25° C., 26° C., 27° C., 28° C., 29° C., 30° C., or lower. Alternatively or in addition, a substrate may be stored within a range of any two values defined above. The substrate may be sealed within a vacuum-sealed environment (e.g., chamber, packaging, etc.). The substrate may be stored within an environment comprising nitrogen and/or an inert gas. For example, the substrate may be vacuum-sealed within a package or container, which is back-filled with nitrogen and/or an inert gas. The substrate may be stored within an environment comprising a desiccant packet (e.g., comprising silica gel, clay, etc.) and/or an oxygen-absorbing packet (e.g., comprising iron oxide powder, etc.). The substrate may be stored under such conditions for any amount of time, for example, at least about 10 minutes, 20 minutes, 30 minutes, 40 minutes, 50 minutes, 1 hour, 2 hours, 3 hours, 4 hours, 5 hours, 6 hours, 7 hours, 8 hours, 9 hours, 10 hours, 11 hours, 12 hours, 13 hours, 14 hours, 15 hours, 16 hours, 17 hours, 18 hours, 19 hours, 20 hours, 21 hours, 22 hours, 23 hours, 1 day, 2 days, 3 days, 4 days, 5 days, 6 days, 7 days, 8 days, 9 days, 10 days, 11 days, 12 days, 13 days, 2 weeks, 3 weeks, 4 weeks, 5 weeks, 6 weeks, 7 weeks, 8 weeks, 9 weeks, 10 weeks, 11 weeks, 3 months, 4 months, 5 months, 6 months, 7 months, 8 months, 9 months, 10 months, 11 months, 1 year, 2 years, 3 years, or longer. Alternatively or in addition, the substrate may be stored under such conditions for at most about 10 minutes, 20 minutes, 30 minutes, 40 minutes, 50 minutes, 1 hour, 2 hours, 3 hours, 4 hours, 5 hours, 6 hours, 7 hours, 8 hours, 9 hours, 10 hours, 11 hours, 12 hours, 13 hours, 14 hours, 15 hours, 16 hours, 17 hours, 18 hours, 19 hours, 20 hours, 21 hours, 22 hours, 23 hours, 1 day, 2 days, 3 days, 4 days, 5 days, 6 days, 7 days, 8 days, 9 days, 10 days, 11 days, 12 days, 13 days, 2 weeks, 3 weeks, 4 weeks, 5 weeks, 6 weeks, 7 weeks, 8 weeks, 9 weeks, 10 weeks, 11 weeks, 3 months, 4 months, 5 months, 6 months, 7 months, 8 months, 9 months, 10 months, 11 months, 1 year, 2 years, 3 years, or less.

A plurality of organosilane-functionalized locations may have an average diameter of at least 10%, 20%, 30%, 40%, 50%, 60%, 70%, 80%, 90%, 100%, 120%, 150%, 175%, 200%, 250%, 300%, 350%, 350%, or more of a bead diameter. Alternatively, a bead may have a diameter of at least 10%, 20%, 30%, 40%, 50%, 60%, 70%, 80%, 90%, 100%, 120%, 150%, 175%, 200%, 250%, 300%, 350%, 350%, or more of an organosilane-functionalized location diameter. A bead may have a diameter of about 0.1 nanometer (nm), 0.2 nm, 0.3 nm, 0.4 nm, 0.5 nm, 0.6 nm, 0.7 nm, 0.8 nm, 0.9 nm, 1.0 nm, 1.1 nm, 1.2 nm, 1.3 nm, 1.4 nm, 1.5 nm, 1.6 nm, 1.7 nm, 1.7 nm, 1.8 nm, 1.9 nm, or 2 μm, or within a range defined by any two of the preceding values.

The substrate surface may comprise at least about 250 organosilane-functionalized locations per millimeter2 (/mm2), 1,000/mm2, 2500/mm2, 25,000/mm2, 50,000/mm2, 100,000/mm2, 200,000/mm2, 250,000/mm2, 300,000/mm2, 350,000/mm2, 400,000/mm2, 450,000/mm2, 500,000/mm2, 550,000/mm2, 600,000/mm2, 650,000/mm2, 700,000/mm2, 750,000/mm2, 800,000/mm2, 850,000/mm2, 1 million/mm2, 1.2 million/mm2, 1.5 million/mm2, 1.8 million/mm2, 2.0 million/mm2, 2.5 million/mm2, 3 million/mm2, 3.5 million/mm2, 4.0 million/mm2, 4.5 million/mm2, 5 million/mm2, 10 million/mm2, 12 million/mm2, 14 million/mm2, 16 million/mm2, 18 million/mm2, 25 million/mm2, 30 million/mm2, 250 million/mm2, 2.5 billion/mm2, 25 billion/mm2, 250 billion/mm2, or more organosilane-functionalized locations per mm2. In some substrate locations, the organosilane-functionalized locations may be located with a density that is within a range defined by any two of the preceding values.

In some cases, a surface comprising a plurality of organosilane-functionalized locations may be loaded with a sample comprising beads (or analytes, reagents, or any combination thereof, etc.) (e.g., as described herein with regards to loading a plurality of individually addressable locations). In some cases, the organosilane-functionalized locations may be indexed, e.g., spatially, such that an analyte immobilized or coupled to each organosilane-functionalized le location may be identified from a plurality of analytes immobilized to other organosilane-functionalized locations (e.g., as described herein with regards to indexing a plurality of individually addressable locations). In some cases, any function performed with regards to an individually addressable location (as described herein) may be similarly performed with respect to an organosilane-functionalized location.

EXAMPLES

Certain examples of the following examples illustrate various methods of making individually addressable locations and organosilane-functionalized locations described herein. It is understood that one skilled in the art may be able to make these locations by similar methods or by combining other methods known to one skilled in the art. It is also understood that one skilled in the art would be able to make other locations in a similar manner as described below by using the appropriate starting materials and modifying processing routes as needed. In general, starting materials, reagents, and equipment can be obtained from commercial vendors or synthesized according to sources known to those skilled in the art or combined as described herein.

Yields may not be optimized. Reaction times may be approximate and may not be optimized. Materials and instrumentation used in procedures may be substituted with appropriate alternatives. Atomic Force Microscopy (AFM), Fluorescent Optical Microscopy (FOM), Scanning Electron Microscopy (SEM), Transmission Electron Microscopy (TEM), other surface characterization techniques may be used to characterize substrates and bead loading.

Example 1: Single Wet Low Dose

Figure 9:
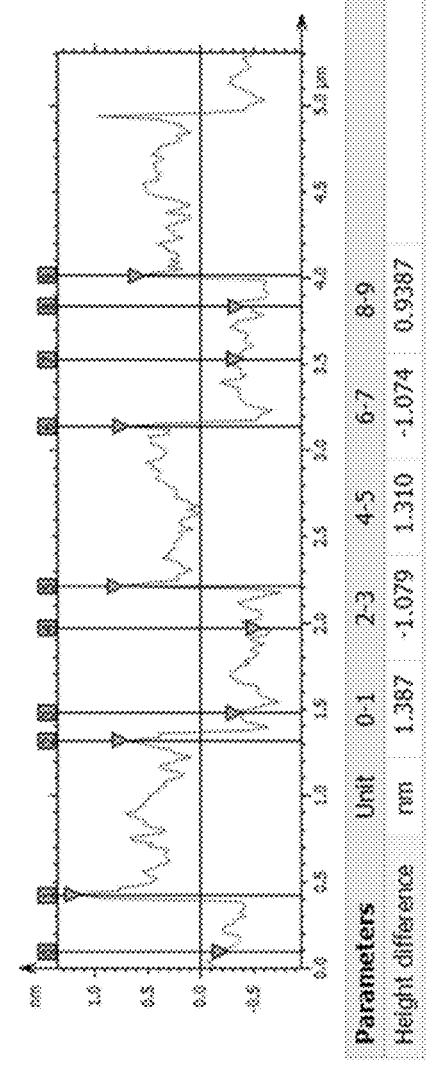
FIG. 9 shows an atomic force microscopy (AFM) image and line scan profile for individually addressable locations generated from a single wet low dose method.
Figure 9:
Figure 9:
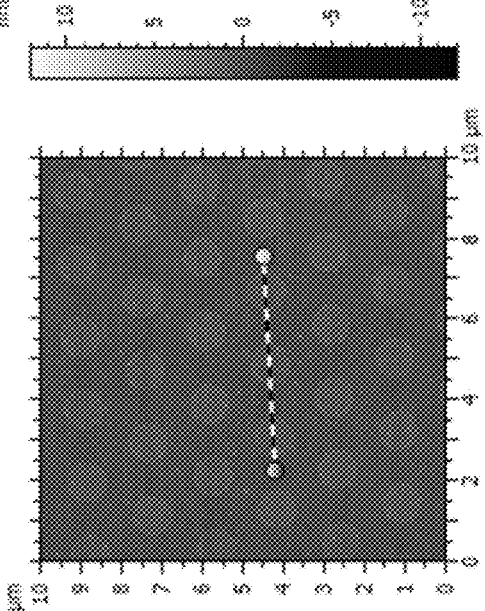
Figure 10:
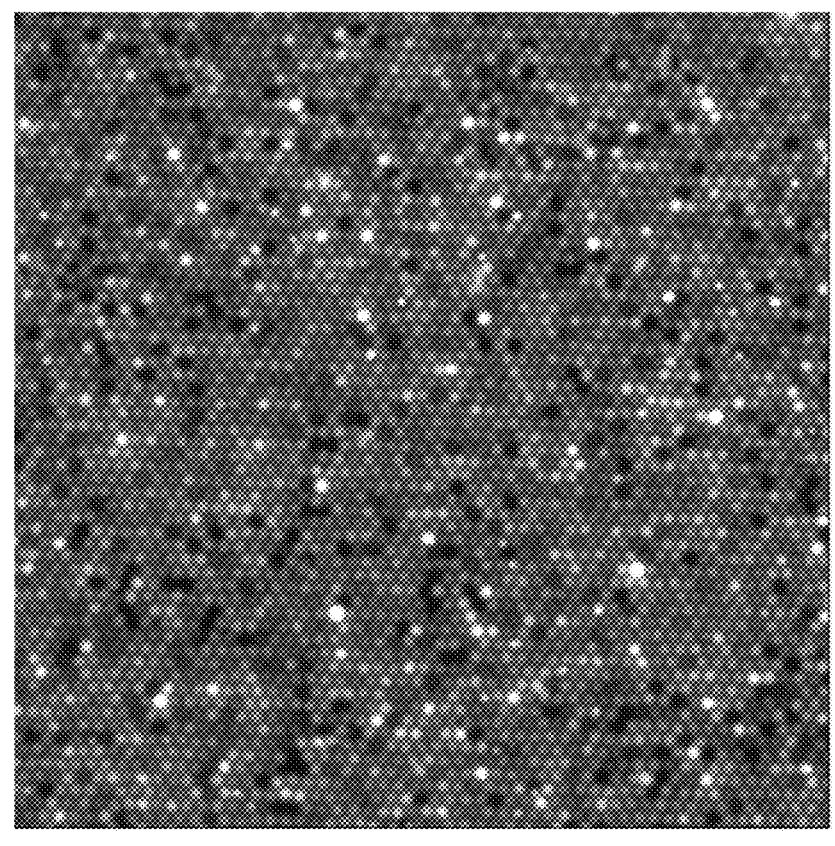
FIG. 10 shows a fluorescent optical microscopy (FOM) image of bead loading on organosilane-functionalized locations generated from a single wet low dose method.

The example demonstrates the production of organosilane-functionalized locations according to the AFM image provided in FIG. 9. The deposition protocol explained with respect to FIGS. 6A-6H was used to generate a plurality of organosilane-functionalized locations on a substrate sample. Additionally, water vapor is introduced to the chamber after oxygen plasma treatment (the step illustrated in FIG. 6F) or before organosilane vapor is introduced to the chamber (as shown in FIG. 6G). Water vapor was introduced to the chamber in ranges between 60-150° C. and 5-300 mTorr. In this example, water vapor is 70° C. and 150 mTorr. As seen in FIG. 9, some of the organosilane-functionalized locations were relatively well-defined, with an average edge height of 1.2 nm with a standard deviation of 0.2 nm. The average edge height and standard deviation were measured by generating a height profile of 3 adjacent organosilane-functionalized locations using a line scan on an AFM instrument to sample a 10 μm×10 μm area with a scan rate of 1 Hertz (Hz) and 512 pixel resolution (as shown to the right in FIG. 9). However, some of the organosilane-functionalized locations were less well-defined, as can be seen in FIG. 10. FIG. 10 illustrates bead loading on the organosilane-functionalized locations generated via a single low dose method, as imaged using a fluorescent optical microscopy (FOM). The white spots indicate beads which have been immobilized to the generated organosilane-functionalized locations. As can be seen in FIG. 10, bead loading distribution is not homogenous throughout the substrate. Specifically, the presence of bright white spots (indicative of bead aggregates—e.g., two or more beads in a cluster) illustrates that bead clumping and/or irregular bead loading is occurring. In addition, the presence of dark spots indicates the absence of beads at other locations.

Example 2: Water Plasma

Figure 11:
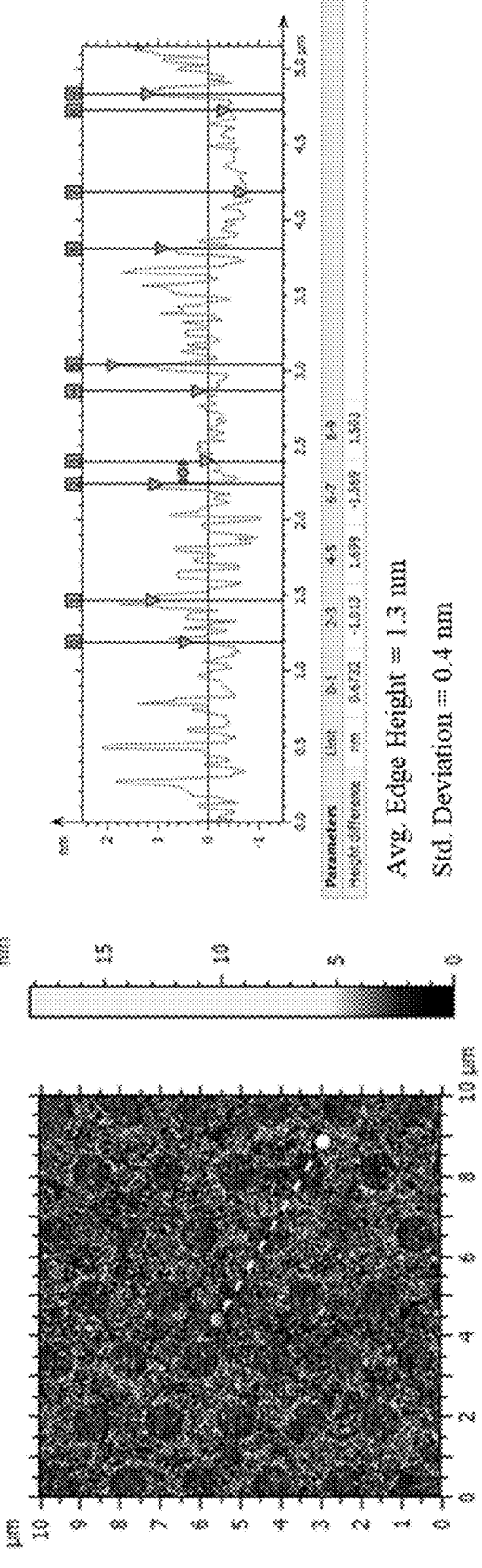
FIG. 11 shows an AFM image and line scan profile for individually addressable locations generated from a water plasma method.
Figure 12:
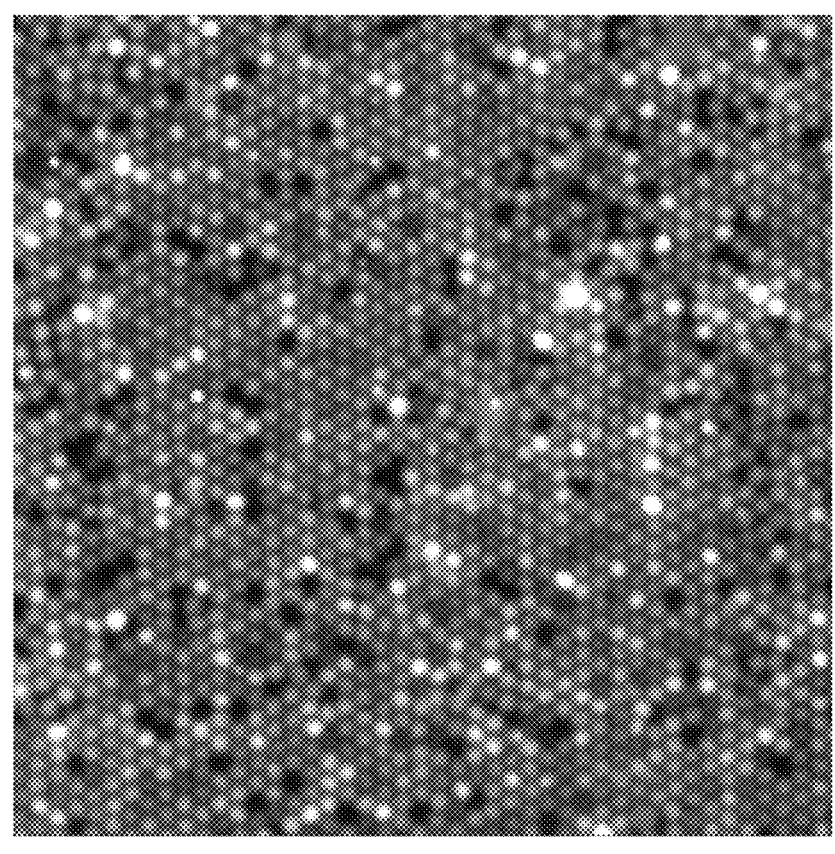
FIG. 12 shows a FOM image of bead loading on organosilane-functionalized locations generated from a water plasma method.

The example demonstrates the production of organosilane-functionalized locations according to the AFM image provided in FIG. 11. The deposition protocol explained with respect to FIGS. 6A-6H was used to generate a plurality of organosilane-functionalized locations on a substrate sample. Water plasma is introduced to the chamber after oxygen plasma treatment (the step illustrated in FIG. 6F) or before organosilane vapor is introduced to the chamber (as shown in FIG. 6G). Water plasma is generated using 250 watt (W) radiofrequency (RF) power for 3 to 10 minutes. FIG. 11 illustrates a portion of the substrate sample after water plasma treatment. As seen in FIG. 11, the organosilane-functionalized locations were relatively undefined, with an average edge height of 1.3 nm with a standard deviation of 0.4 nm. The average edge height and standard deviation were measured by generating a height profile of 3 adjacent organosilane-functionalized locations using a line scan on an AFM instrument to sample a 10 μm×10 μm area with a scan rate of 1 Hertz (Hz) and 512 pixel resolution as shown to the right. FIG. 12 illustrates bead loading on the organosilane-functionalized locations generated via a water plasma method, as imaged using a fluorescent optical microscope (FOM). The white spots indicate beads, with more intense white spots indicating bead aggregation and dark spots indicating the absence of beads. As can be seen in FIG. 12, bead loading distribution is not homogenous.

Example 3: 5× Multi-Low Dose

Figure 13:
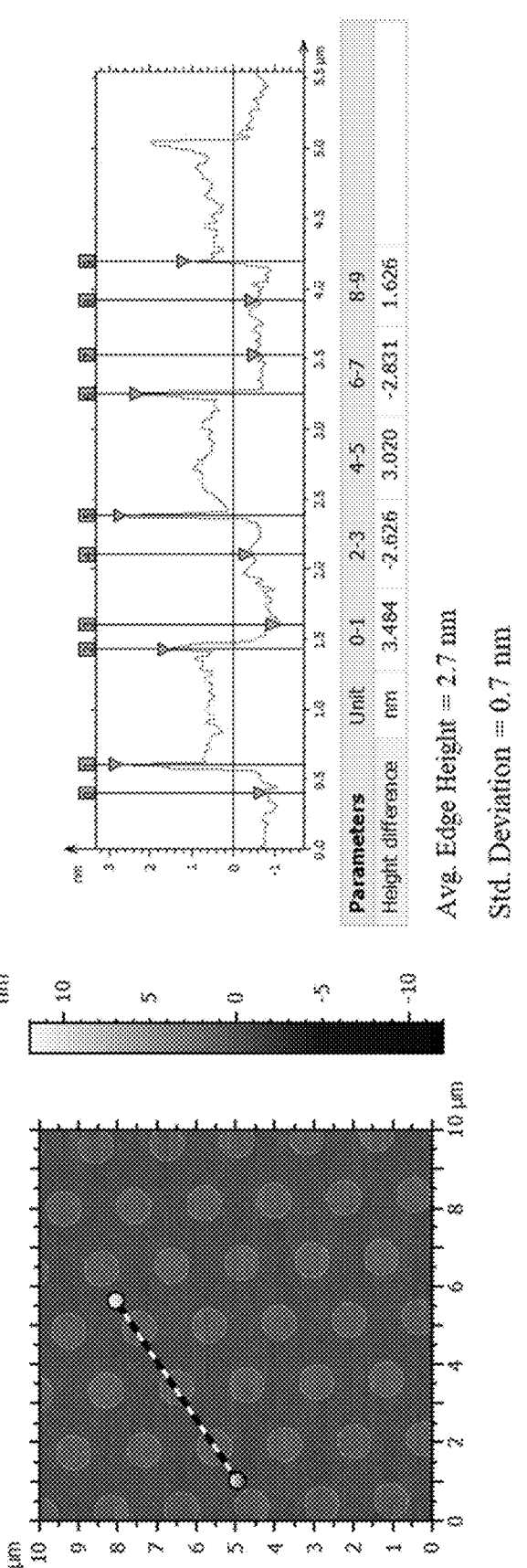
FIG. 13 shows an AFM image and line scan profile for individually addressable locations generated from a 5× multi low dose method.
Figure 14:
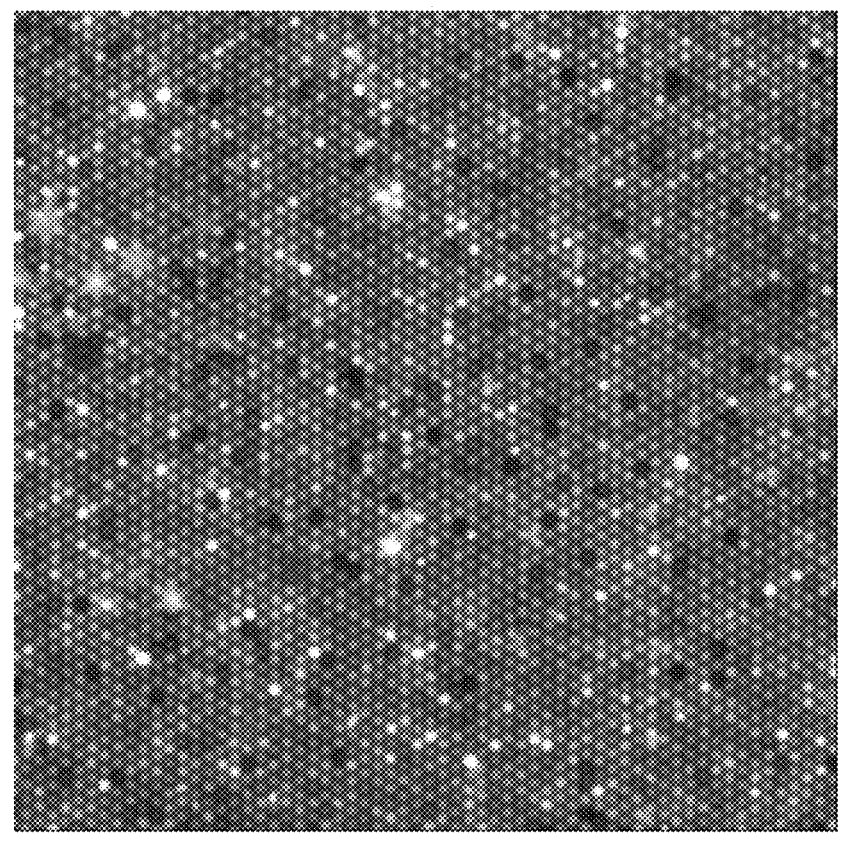
FIG. 14 shows a FOM image of bead loading on organosilane-functionalized locations generated from a 5× multi low dose method.

The example demonstrates the production of organosilane-functionalized locations according to the AFM image provided in FIG. 13. The deposition protocol explained with respect to FIGS. 6A-6H was used to generate a plurality of organosilane-functionalized locations on a substrate sample. FIG. 13 illustrate the substrate sample after the 5× multi-low dose treatment. As seen in FIG. 13, the organosilane-functionalized locations were relatively well defined, with an average edge height of 2.7 nm with a standard deviation of 0.7 nm. The average edge height and standard deviation were measured by generating a height profile of 3 adjacent organosilane-functionalized locations using a line scan on an AFM instrument to sample a 10 μm×10 μm area with a scan rate of 1 Hertz (Hz) and 512 pixel resolution as shown to the right. FIG. 14 illustrates bead loading on the organosilane-functionalized locations generated via a 5× multi-low dose method, as imaged using a fluorescent optical microscope. The white spots indicate beads, with more intense white spots indicating bead aggregation and dark spots indicating the absence of beads. As seen in FIG. 14 (especially in comparison with FIGS. 10 and 11), bead loading distribution is relatively homogenous.

Example 4: Single High Dose

Figure 15:
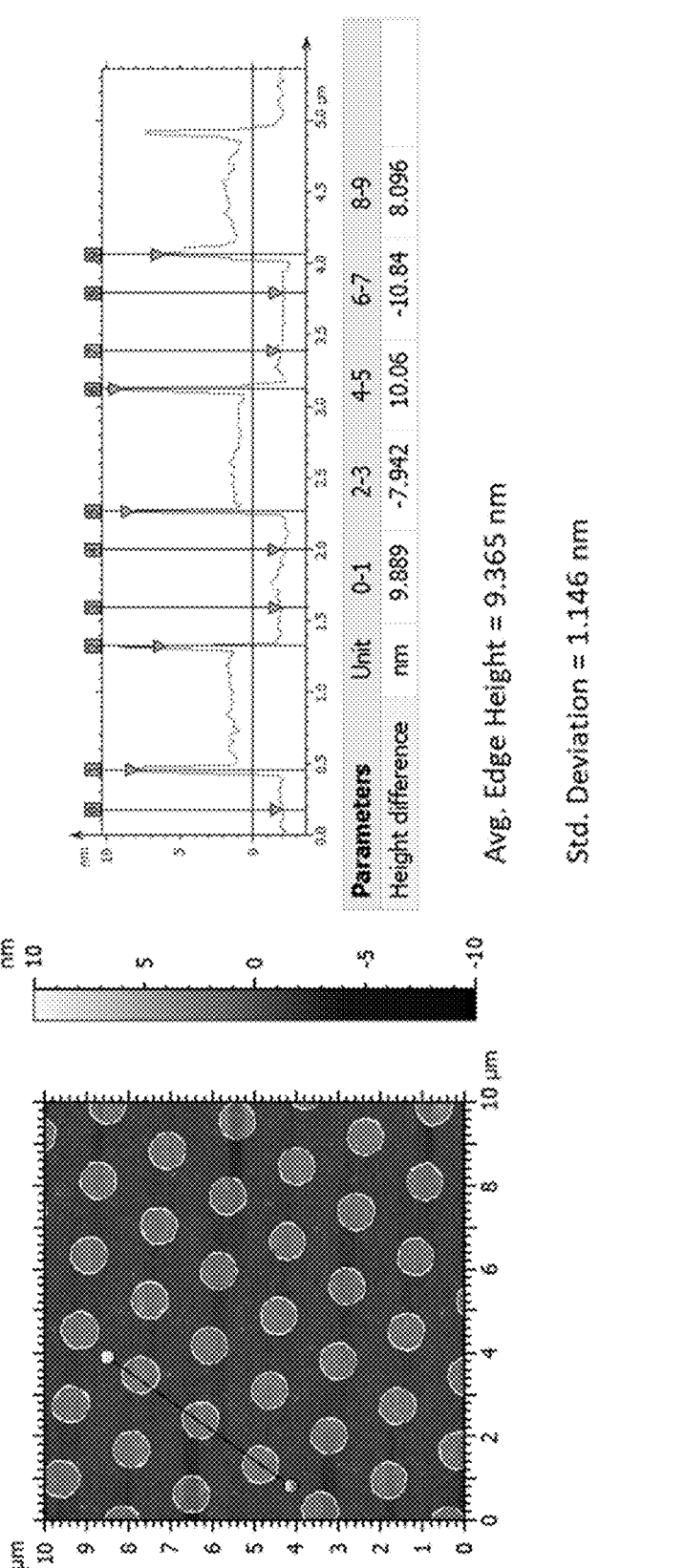
FIG. 15 shows an AFM image for individually addressable locations generated from a single high dose method.
Figure 16:
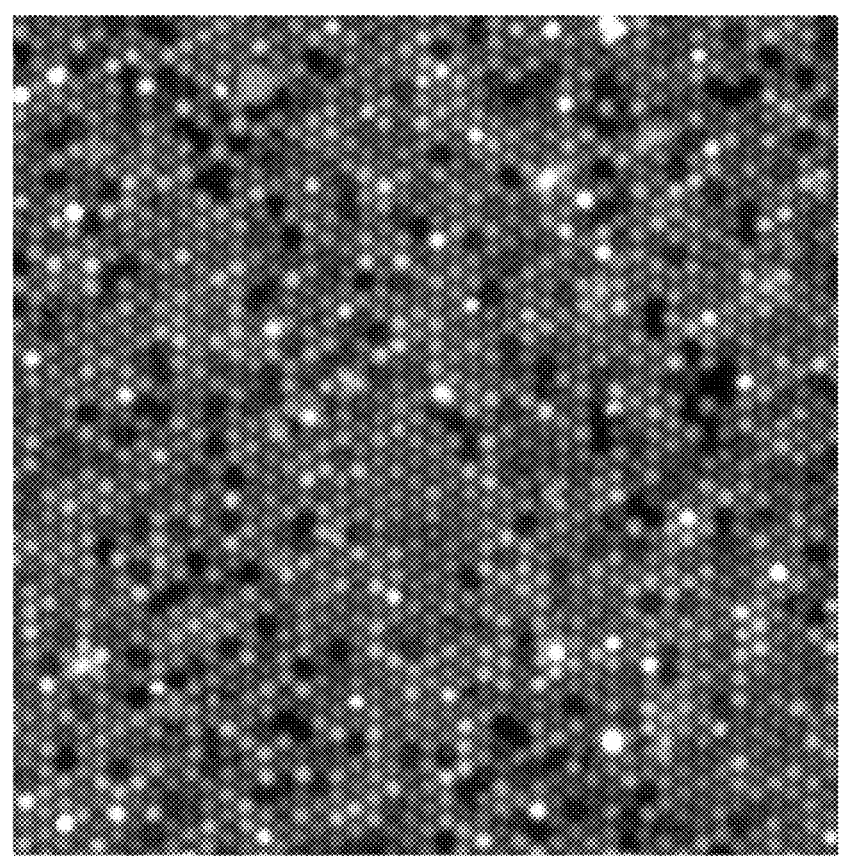
FIG. 16 shows a fluorescent optical microscopy image of bead loading on the organosilane-functionalized locations generated via a single high dose method.

The example demonstrates the production of organosilane-functionalized locations according to the AFM image provided in FIG. 15. The deposition protocol explained with respect to FIGS. 6A-6H was used to generate a plurality of organosilane-functionalized locations on a substrate sample. In this example, a single high dose defined by a dose of at least $1\times10^{24}$ molecules was utilized. As seen in FIG. 15, the organosilane-functionalized locations were relatively well defined, with an average edge height of 9.365 nm and a standard deviation of 1.146 nm. The average edge height and standard deviation were measured by generating a height profile of 3 adjacent organosilane-functionalized locations using a line scan on an AFM instrument to sample a 10 μm×10 μm area with a scan rate of 1 Hertz (Hz) and 512 pixel resolution as shown to the right. As compared to the results of the low dose experiments described herein, a relatively high dose application of at least $1\times10^{24}$ molecules resulted in greater variation in the organosilane-functionalized location height with a standard deviation of 1.146 nm. As compared to the results of the other low dose experiments described herein, the standard deviation of the edge heights of the organosilane-functionalized locations is significantly higher for this high dose experiment. FIG. 16 illustrates bead loading on the organosilane-functionalized locations generated via a single high dose method, as imaged using fluorescent optical microscopy. The white spots indicate beads, with more intense white spots indicating the presence of more beads (e.g., bead aggregation) and dark spots indicating the absence of beads. As can be seen in FIG. 16, bead loading distribution is not completely homogenous.

Example 5: Edge Thickness Comparison

This example demonstrates the difference in edge thickness for organosilane-functionalized locations generated according to a single high dose method vs a multi-low dose method.

FIG. 17A illustrates, at the top, an AFM image sampling a 10 μm×10 μm area of a substrate treated with a single high dose method (as described with respect to Example 4) and, at the bottom, a height profile of a single location 1711 of the substrate generated using a line scan. The edges of the location 1711 are readily discernible from the peaks 1713 in the height profile. A readout 1715 of the height profile were generated at 4 points across the diameter (along x-axis) of the location, each point corresponding to the start and end of the 'edge' of the location, and is as follows:

| X (μm) | Y (nm) |
|--------|--------|
| 0.423  | −1.19  |
| 0.667  | 0.39   |
| 1.386  | 0.28   |
| 1.630  | −0.94  |

As calculated from the readouts, the left edge (left of peaks 1713) has a thickness of 0.244 μm (0.667-0.423) and the right edge (right of peaks 1713) has a thickness of 0.244 μm (1.630-1.386). It will be appreciated that the 'left edge' and 'right edge' refer to different points of a single edge (e.g., annular edge). The average edge thickness for the edge of the location 1711 is 0.244 μm from these readouts.

FIG. 17B illustrates, at the top, an AFM image sampling a 10 μm×10 μm area of a substrate treated with a multi-low dose method (as described with respect to Example 3) and, at the bottom, a height profile of a single location 1721 of the substrate generated using a line scan. The edges of the location 1721 are readily discernible from the peaks 1723 in the height profile. A readout 1725 of the height profile were generated at 4 points across the diameter (along x-axis) of the location, each point corresponding to the start and end of the 'edge' of the location, and is as follows:

| X (μm) | Y (nm |
|--------|-------|
| 0.199  | 5.525 |
| 0.255  | 6.506 |
| 1.021  | 6.226 |
| 1.101  | 5.623 |

As calculated from the readouts, the left edge (left of peaks 1723) has a thickness of 0.056 μm (0.255-0.199) and the right edge (right of peaks 1723) has a thickness of 0.08 μm (1.101-1.021). It will be appreciated that the 'left edge' and 'right edge' refer to different points of a single edge (e.g., annular edge). The average edge thickness for the edge of the location 1721 is 0.0.068 μm from these readouts.

Unexpectedly, the substrate treated with the multi-low dose method resulted in a significantly thinner edge thickness than the substrate treated with the single high dose method, in this example more than 3 times thinner. This demonstrates that the multi-low dose method produces a thinner condensation ring than the single high dose method. Advantageously, the thinner condensation ring leaves more surface area of the organosilane-functionalized location exposed, and thus increases the surface area with which a bead can interact (e.g., attach) with the location.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A method of generating an organosilane-functionalized substrate, comprising:
  (a) providing a substrate; and
  (b) exposing said substrate to a plurality of doses of organosilane vapor to generate said organosilane-functionalized substrate, wherein a dose of said plurality of doses is at most $1\times10^{24}$ molecules per square meter (m²) of a surface of said substrate wherein exposing said substrate to said plurality of doses of organosilane vapor provide a layer of organosilane functionalization with an average thickness of at least about 1.2 nanometers and a standard deviation of thickness measurements of at most about 1.0 nanometers.

2. The method of claim 1, wherein said plurality of doses comprises at most five doses.

3. The method of claim 1, wherein said plurality of doses comprises at least four doses.

4. The method of claim 1, wherein said dose of said plurality of doses is at least $1\times10^{20}$ molecules per m² of said surface of said substrate.

5. The method of claim 1, further comprising, (i) prior to (a) depositing a resist on said substrate; and (ii) subsequent to (b), removing said resist from said substrate to generate a patterned organosilane-functionalized substrate.

6. The method of claim 1, wherein in (b), said exposing is performed at a predetermined atmospheric pressure from about 5 millitorr (mTorr) to about 50 mTorr.

7. The method of claim 6, wherein said predetermined atmospheric pressure is about 25 mTorr.

8. The method of claim 1, further comprising immobilizing a bead comprising a nucleic acid molecule adjacent to said organosilane-functionalized substrate, wherein said nucleic acid molecule is coupled to the bead.

9. The method of claim 8, wherein said bead is immobilized to said organosilane-functionalized substrate via an electrostatic interaction between a positive charge of said organosilane-functionalized substrate and a negative charge of said bead or a constituent thereof.

10. The method of claim 8, further comprising immobilizing a plurality of beads to said organo-functionalized substrate, wherein an average bead diameter of said plurality of beads is at least about 0.5 microns.

11. The method of claim 1, wherein said organosilane-functionalized substrate comprises aminopropyltrimethoxysilane (APTMS).

12. The method of claim 1, wherein each dose of said plurality of doses is at most $1 \times 10^{24}$ molecules per $m^2$ of said surface of said substrate.

13. The method of claim 1, wherein said organosilane-functionalized substrate is patterned.

14. The method of claim 1, further comprising indexing a plurality of locations on said organosilane-functionalized substrate.

15. The method of claim 14, wherein said indexing comprises immobilizing a plurality of beads at said plurality of locations.

\* \* \* \* \*